United States Patent
Tel et al.

(10) Patent No.: US 11,520,239 B2
(45) Date of Patent: Dec. 6, 2022

(54) SEPARATION OF CONTRIBUTIONS TO METROLOGY DATA

(71) Applicant: ASML NETHERLANDS B.V., Veldhoven (NL)

(72) Inventors: Wim Tjibbo Tel, Helmond (NL); Frank Staals, Eindhoven (NL); Mark John Maslow, Eindhoven (NL); Roy Anunciado, Veldhoven (NL); Marinus Jochemsen, Veldhoven (NL); Hugo Augustinus Joseph Cramer, Eindhoven (NL); Thomas Theeuwes, Veldhoven (NL); Paul Christiaan Hinnen, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/075,696

(22) PCT Filed: Feb. 17, 2017

(86) PCT No.: PCT/EP2017/053700
§ 371 (c)(1),
(2) Date: Aug. 6, 2018

(87) PCT Pub. No.: WO2017/144379
PCT Pub. Date: Aug. 31, 2017

(65) Prior Publication Data
US 2019/0086810 A1    Mar. 21, 2019

Related U.S. Application Data

(60) Provisional application No. 62/459,327, filed on Feb. 15, 2017, provisional application No. 62/382,764, (Continued)

(51) Int. Cl.
*G03F 7/20* (2006.01)

(52) U.S. Cl.
CPC .......... *G03F 7/705* (2013.01); *G03F 7/70508* (2013.01); *G03F 7/70625* (2013.01); *G03F 7/70633* (2013.01); *G03F 7/70641* (2013.01)

(58) Field of Classification Search
CPC .. G03F 7/705; G03F 7/70508; G03F 7/70625; G03F 7/70633; G03F 7/70641; G03F 7/7065
See application file for complete search history.

(56) References Cited

U.S. PATENT DOCUMENTS

| 5,736,280 A | 4/1998 | Tsudaka |
| 8,572,518 B2 | 10/2013 | Tyminski et al. |

(Continued)

FOREIGN PATENT DOCUMENTS

| CN | 101762988 | 6/2010 |
| CN | 102914945 | 2/2013 |

(Continued)

OTHER PUBLICATIONS

Yu et al., "Contribution of Etch to Metal CD Variability", First International Workshop on Statistical Metrology, Jun. 1996. (Year: 1996).*

(Continued)

*Primary Examiner* — Jack Chiang
*Assistant Examiner* — Aric Lin
(74) *Attorney, Agent, or Firm* — Pillsbury Winthrop Shaw Pittman LLP

(57) ABSTRACT

A method including: computing a value of a first variable of a pattern of, or for, a substrate processed by a patterning process by combining a fingerprint of the first variable on the substrate and a certain value of the first variable; and determining a value of a second variable of the pattern based at least in part on the computed value of the first variable.

21 Claims, 23 Drawing Sheets

Related U.S. Application Data filed on Sep. 1, 2016, provisional application No. 62/298,367, filed on Feb. 22, 2016.

(56) References Cited

U.S. PATENT DOCUMENTS

| | | | |
|---|---|---|---|
| 9,529,253 B2 | 12/2016 | Tyminski et al. | |
| 2003/0008242 A1* | 1/2003 | Schedel | G03F 7/38 430/313 |
| 2006/0066855 A1 | 3/2006 | Boef et al. | |
| 2007/0273852 A1* | 11/2007 | Arai | G03F 7/70458 355/44 |
| 2008/0248403 A1* | 10/2008 | Yu | G03F 7/70625 430/5 |
| 2010/0161099 A1* | 6/2010 | Mos | G03B 27/42 700/104 |
| 2011/0153265 A1 | 6/2011 | Staals et al. | |
| 2013/0080984 A1 | 3/2013 | Liu et al. | |
| 2014/0046646 A1 | 2/2014 | Cao et al. | |
| 2015/0138523 A1 | 5/2015 | Jak et al. | |
| 2016/0042105 A1* | 2/2016 | Adel | G06F 30/20 703/6 |
| 2016/0246185 A1 | 8/2016 | Ypma et al. | |
| 2017/0010538 A1 | 1/2017 | Hansen | |
| 2019/0086810 A1 | 3/2019 | Tel et al. | |

FOREIGN PATENT DOCUMENTS

| | | |
|---|---|---|
| CN | 104350424 | 2/2015 |
| JP | H08148404 | 6/1996 |
| JP | 2000292906 | 10/2000 |
| JP | 2008294155 | 12/2008 |
| JP | 2009239029 | 10/2009 |
| JP | 2011142319 | 7/2011 |
| JP | 2013012773 | 1/2013 |
| JP | 2013503493 | 1/2013 |
| KR | 10-0819189 | 4/2008 |
| TW | 525254 | 3/2003 |
| TW | 201117259 | 5/2011 |
| TW | 201516598 | 5/2015 |
| TW | 201526130 | 7/2015 |
| TW | 201543172 | 11/2015 |
| TW | 201826033 | 7/2018 |
| WO | 2002-009170 | 1/2002 |
| WO | 200209170 | 1/2002 |
| WO | 2004095547 | 11/2004 |
| WO | 2015197313 | 12/2015 |
| WO | 2016128189 | 8/2016 |

OTHER PUBLICATIONS

Yu et al., "SEM characterization of etch and develop contributions to poly-CD error", Proc. SPIE 2725, Metrology, Inspection, and Process Control for Microlithography X, May 1996. (Year: 1996).*

Donis G. Flagello, Hans van der Laan, Jan B.P. van Schoot, Igor Bouchoms, and Bernd Geh "Understanding systematic and random CD variations using predictive modeling techniques", Proc. SPIE 3679, Optical Microlithography XII, (Jul. 26, 1999) (Year: 1999).*

Taiwanese Office Action issued in Taiwanese Patent Application No. 107119466, dated Mar. 22, 2019.

International Search Report and Written Opinion issued in corresponding PCT Application No. PCT/EP2017/053700, dated May 9, 2017, 12 pages.

Taiwanese Office Action issued in Taiwanese Patent Application No. 106105681, dated Jan. 5, 2018, with English translation, 11 pages.

Chinese Office Action issued in corresponding Chinese Patent Application No. 201780012362.4, dated Jun. 19, 2020.

Korean Office Action issued in corresponding Korean Patent Application No. 10-2018-7027042, dated Mar. 11, 2020.

Chinese Office Action issued in corresponding Chinese Patent Application No. 201780012362.4, dated Dec. 18, 2019.

Taiwanese Office Action issued in corresponding Taiwanese Patent Application No. 108125155, dated Oct. 30, 2020.

Korean Office Action issued in corresponding Korean Patent Application No. 10-2018-7027042, dated Sep. 29, 2020.

Korean Office Action issued in corresponding Korean Patent Application No. 10-2021-7018005, dated Jun. 25, 2021.

Japanese Office Action issued in corresponding Japanese Patent Application No. 2020-090952, dated May 18, 2021.

Taiwanese Office Action issued in corresponding Taiwanese Application No. 11011756, dated Mar. 23, 2022.

Taiwanese Office Action issued in corresponding Taiwanese Patent Application No. 110111756, dated Jun. 24, 2022.

Korean Office Action issued in corresponding Korean Patent Application No. 10-2022-7000687, dated Jun. 18, 2022.

"Nanochip Fab Solutions", Applied Materials, vol. 6, Issue II, 2011.

* cited by examiner

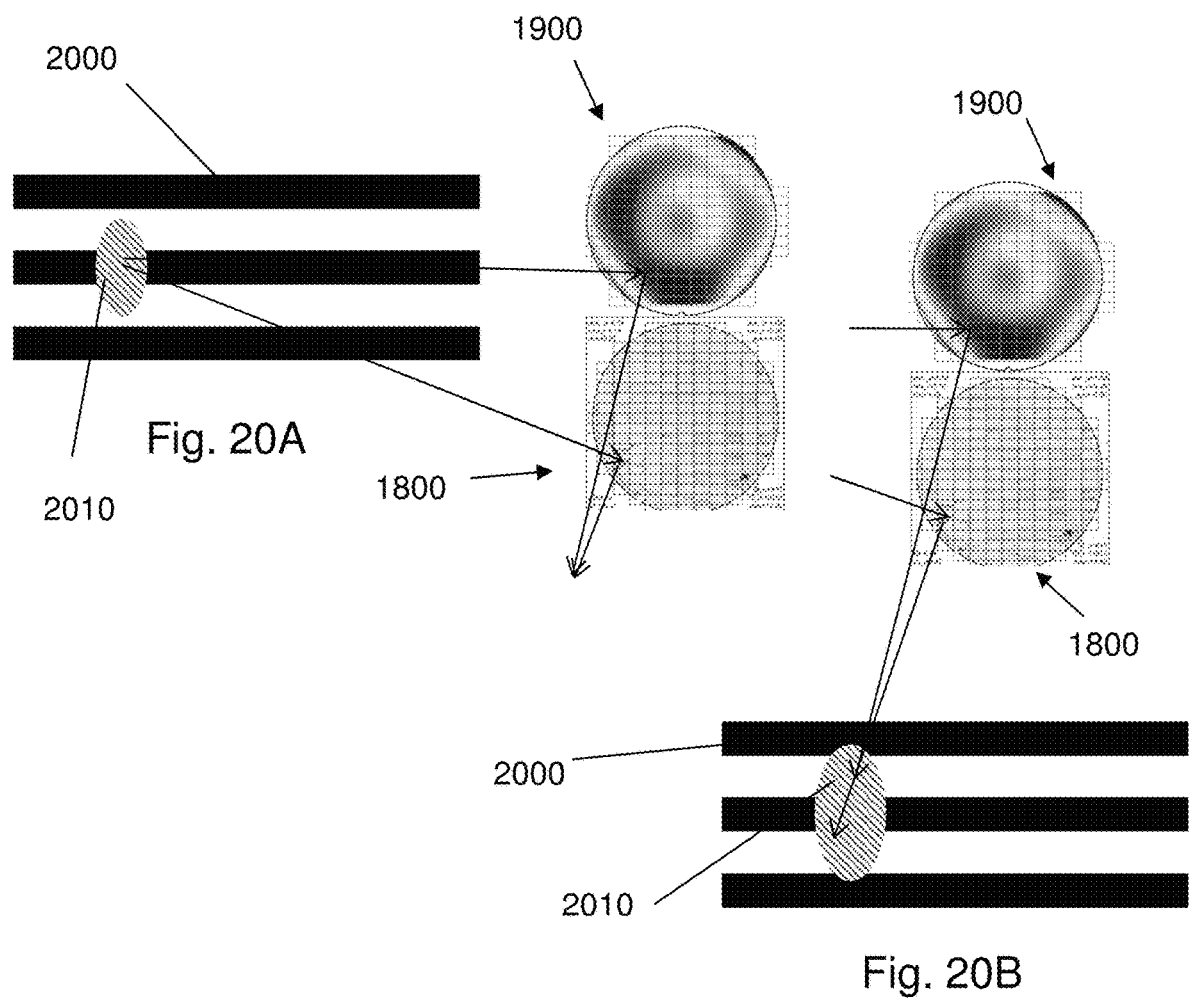
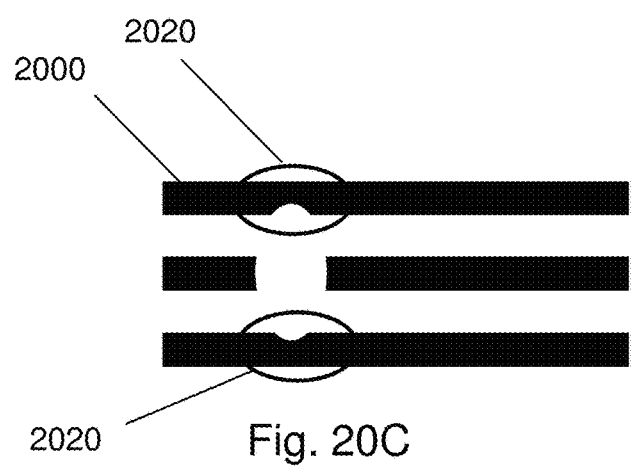
Fig. 20A
Fig. 20B
Fig. 20C

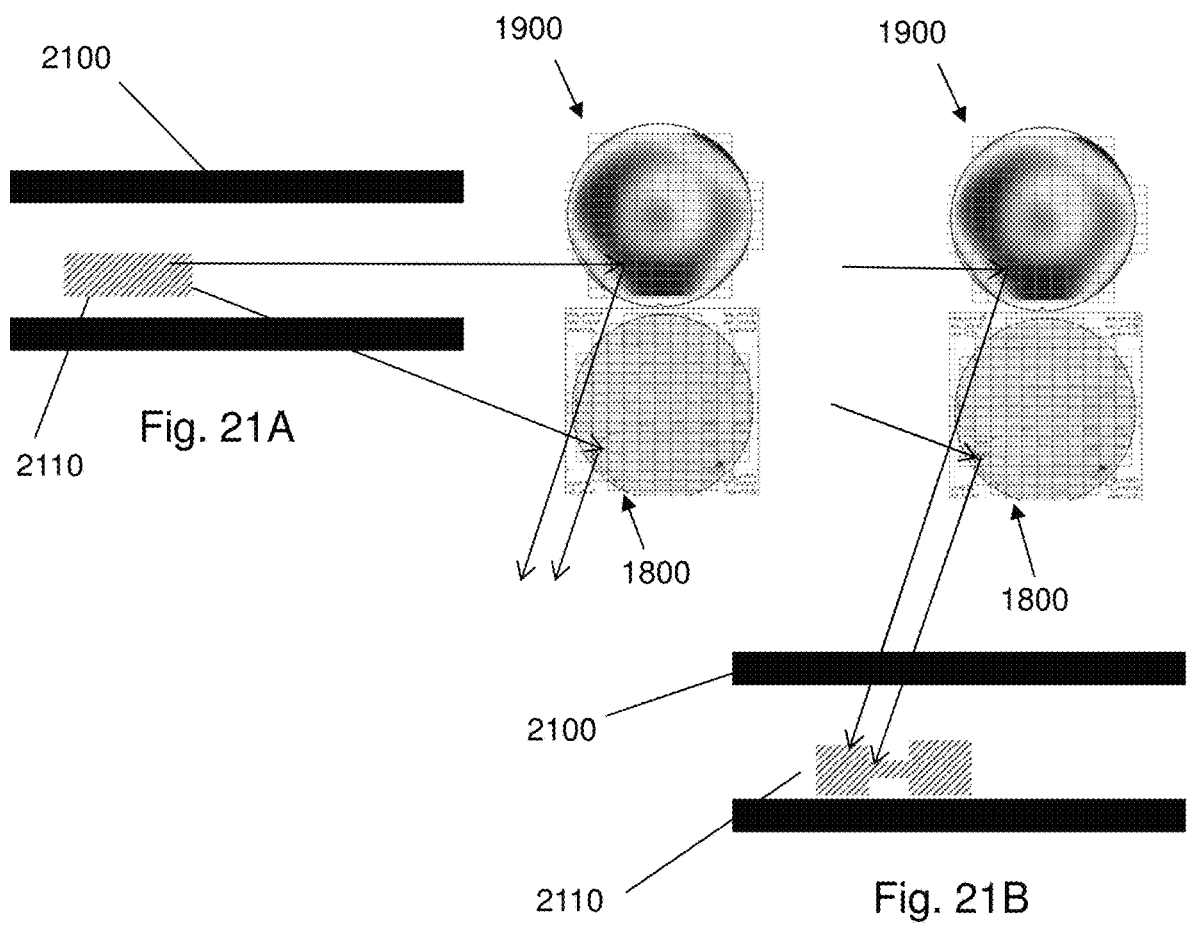
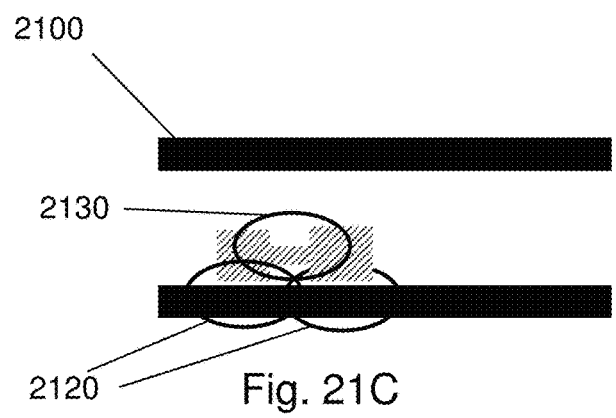
Fig. 21A
Fig. 21B
Fig. 21C

SEPARATION OF CONTRIBUTIONS TO METROLOGY DATA

CROSS-REFERENCE TO RELATED APPLICATIONS

This application is the U.S. national phase entry of PCT patent application no. PCT/EP2017/053700, which was filed on Feb. 17, 2017, which claims the benefit of priority of U.S. provisional application No. 62/298,367, which was filed on Feb. 22, 2016, and U.S. provisional application No. 62/382,764, which was filed on Sep. 1, 2016, and U.S. provisional application No. 62/459,327, which was filed on Feb. 15, 2017, each of which is incorporated herein in its entirety by reference.

FIELD

The present disclosure relates to a method of improving the performance of a device manufacturing process. The method may be used in connection with a lithographic apparatus or a metrology apparatus.

BACKGROUND

A lithography apparatus is a machine that applies a desired pattern onto a target portion of a substrate. Lithography apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithography apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

SUMMARY

Disclosed herein is a method comprising: obtaining a first contribution of a modelable processing variable to metrology data of a pattern on a substrate; obtaining a second contribution of an unmodeled processing variable to the metrology data of the pattern; and obtaining, by a hardware computer, the metrology data by combining the first contribution and the second contribution.

According to an embodiment, the metrology data comprises one or more selected from a critical dimension (CD), critical dimension uniformity (CDU), a sidewall angle, an edge position, overlay, focus, and/or pattern shift.

According to an embodiment, the metrology data comprise a statistic of a group of patterns.

According to an embodiment, the unmodeled processing variable is a characteristic of a process downstream to exposure of the substrate.

According to an embodiment, the process is development of a resist layer on the substrate.

According to an embodiment, the process is etching of the substrate.

According to an embodiment, the unmodeled processing variable is a characteristic of the substrate.

According to an embodiment, the unmodeled processing variable is a characteristic of a resist layer on the substrate.

According to an embodiment, a value of the unmodeled processing variable is unknown.

According to an embodiment, combining the first contribution and the second contribution comprises adding the first contribution and the second contribution, or convoluting the first contribution and the second contribution.

Disclosed herein is a method comprising: obtaining a contribution of a second processing variable to metrology data of a pattern on a substrate by removing, by a hardware computer, a contribution of a first processing variable to the metrology data.

According to an embodiment, the first processing variable is modelable.

According to an embodiment, obtaining the contribution of the first processing variable is by modeling.

According to an embodiment, the contribution of the first processing variable is a non-linear function of the second processing variable.

According to an embodiment, the first processing variable is unmodeled.

According to an embodiment, the contribution of the first processing variable is determined experimentally or empirically.

Disclosed herein is a method comprising: obtaining contribution of change of a second group of one or more processing variables to metrology data of a first pattern on a substrate by removing from the metrology data contribution of change of a first group of one or more processing variables to the metrology data; and obtaining, by a hardware computer, contribution of change of the second group of one or more processing variables to metrology data of a second pattern on the substrate based on the contribution of change of the second group of one or more processing variables to the metrology data of the first pattern.

According to an embodiment, the method further comprises reducing a probability of defect at the second pattern by adjusting the first group of one or more processing variables based on the contribution of change of the second group of one or more processing variables to metrology data of the second pattern.

According to an embodiment, the contribution of change of the second group of one or more processing variables to the metrology data of the second pattern is obtained without obtaining the metrology data of the second pattern.

According to an embodiment, the probability of defect at the second pattern is reduced without performing metrology on the second pattern.

According to an embodiment, the method further comprises obtaining a contribution of change of the first group of one or more processing variables to the metrology data of the second pattern by removing from the metrology data of the second pattern contribution of change of the second group of one or more processing variables to the metrology data of the second pattern.

According to an embodiment, the contribution of change of the first group of one or more processing variables to the metrology data of the second pattern is obtained without obtaining values of the first group of one or more processing variables at the second pattern.

According to an embodiment, the method further comprises reducing a probability of a defect at the second pattern by adjusting one or more processing variables of the first group of one or more processing variables based on: the contribution of change of the first group of one or more processing variables to the metrology data of the second pattern, the contribution of change of the second group of one or more processing variables to the metrology data of the second pattern, or both.

Disclosed herein is a method comprising: obtaining a contribution of change of a second group of one or more processing variables to metrology data of a first pattern by removing a contribution of change of a first group of processing variables to the metrology data of the first pattern; obtaining a contribution of change of the second group of one or more processing variables to metrology data of a second pattern on the substrate based on the contribution of change of the second group of one or more processing variables to the metrology data of the first pattern; obtaining, by a hardware computer, a sub-process window (sub-PW) spanned by the first group of processing variables for the second pattern based on the contribution of change of the second group of one or more processing variables to the metrology data of the second pattern.

According to an embodiment, the first group comprises all modelable processing variables and the second group comprises all unmodeled processing variables.

According to an embodiment, the method further comprises decreasing a probability of a defect at the second pattern by adjusting values of one or more processing variables of the first group of processing variables based on the sub-PW.

Disclosed herein is a method comprising: obtaining an estimate of metrology data of a hot spot by combining a contribution of change of a first group of one or more modelable processing variables to the metrology data and contribution of change of a second group of one or more unmodeled processing variables to the metrology data; and determining, by a hardware computer, whether there is a defect at the hot spot based on the estimate of the metrology data.

According to an embodiment, the estimate is obtained without performing metrology on the hot spot.

Disclosed herein is a method comprising: obtaining a contribution of change of a second group of one or more processing variables to metrology data of a pattern by removing a contribution of change of a first group of one or more processing variables from the metrology data; obtaining values of parameters of a model for determining the contribution of change of the second group of one or more processing variables to the metrology data, by fitting, by a hardware computer, the parameters against the contribution of change of the second group of one or more processing variables to the metrology data of the pattern.

According to an embodiment, the first group of one or more processing variables comprises all unmodeled processing variables.

According to an embodiment, all the processing variables in the second group of one or more processing variables are modelable.

Disclosed herein is a method comprising: obtaining an estimate of metrology data of a pattern on a substrate by combining a contribution of change of all modelable processing variables to the metrology data and a contribution of change of all unmodeled processing variables to the metrology data; determining whether the estimate of the metrology data meets a criterion; and if the estimate does not meet the criterion, adjusting, by a hardware computer, a relationship between the unmodeled processing variables and the contribution of change of all the unmodeled processing variables to the metrology data.

According to an embodiment, adjusting the relationship comprises changing a chemical composition of a resist on the substrate.

According to an embodiment, adjusting the relationship comprises changing a chemical used in developing a resist on the substrate.

According to an embodiment, adjusting the relationship comprises changing an etching apparatus used to etch the substrate.

Disclosed herein is a method comprising: computing a value of a first variable of a pattern of, or for, a substrate processed by a patterning process by combining a fingerprint of the first variable on the substrate and a certain value of the first variable; and determining a value of a second variable of the pattern based at least in part on the computed value of the first variable.

According to an embodiment, the determining the value of the second variable of the pattern comprises adjusting, by a hardware computer, the second variable until a reconstruction or simulation result based at least in part on the computed value of the first variable and on the second variable satisfies a rule.

According to an embodiment, the rule indicates a difference between a measurement result of the pattern on the substrate and the reconstruction/simulation result crosses or meets a threshold.

According to an embodiment, the reconstruction/simulation result is a computed radiation distribution, and the measurement result is a measured radiation distribution.

According to an embodiment, a change in the first variable results in a greater difference in the reconstruction or simulation result than a same change in the second variable.

According to an embodiment, the first variable is related to a metrology target on a substrate.

According to an embodiment, the first variable is a critical dimension of a pattern of the metrology target on the substrate.

According to an embodiment, the second variable is related to the metrology target on the substrate.

According to an embodiment, the second variable comprises one or more selected from: a sidewall angle of a pattern of the metrology target, a height of a pattern of the metrology target, a thickness of a layer of the metrology target, a resist loss in the pattern of the metrology target during development, footing of the metrology target, a refractive index of a layer of the metrology target, absorption of a layer of the metrology target, and/or an extinction coefficient of a layer of the metrology target.

According to an embodiment, the method further comprises predicting whether there is a defect following a process downstream to transfer of the pattern onto the substrate based on the second variable of the pattern.

According to an embodiment, responsive to a prediction of a defect at the pattern following the process downstream to transfer of the pattern onto the substrate, a variable of the patterning process for the substrate or another substrate is adjusted.

According to an embodiment, the process comprises development of a resist layer on the substrate.

According to an embodiment, the process comprises etching of the substrate.

According to an embodiment, the method further comprises obtaining the fingerprint of the first variable by combining a first contribution from a first group of one or more variables related to a lithographic apparatus of the patterning process, a second contribution from a second group of one or more variables related to one or more fabrication processes prior to, or after, transfer of the pattern in the lithographic apparatus, and a third contribution from a third group of one or more variables related to a patterning device used in the transfer of the pattern.

According to an embodiment, the first group of variables includes one or more variables of illumination by the lithographic apparatus, a projection system of the lithographic apparatus, a moving standard deviation of movement of a substrate stage of the lithographic apparatus, a moving average of movement of the substrate stage, focus, dose, bandwidth, exposure duration, a high frequency laser bandwidth change, a high frequency laser wavelength change, and/or flatness of the substrate.

According to an embodiment, the second group of variables includes one or more variables of spin coating, post exposure bake, development, etching, deposition, doping, and/or packaging.

According to an embodiment, the third group of variables includes one or more variables of mask CD, a shape and/or location of an assist pattern, and/or an adjustment applied by a resolution enhancement technique.

According to an embodiment, combining the fingerprint of the first variable and the certain value of the first variable comprises adding the fingerprint of the first variable and the certain value of the first variable.

According to an embodiment, the certain value of the first variable is obtained by averaging a group of measurements of the first variable on the substrate.

According to an embodiment, the certain value of the first variable is a design value of the first variable.

According to an embodiment, the first variable used during the determining the value of the second variable has a value restricted within a certain range around the computed value of the first variable.

Disclosed herein is a method comprising: obtaining an across substrate fingerprint of a variable associated with a pattern created by a patterning process; and predicting, by a hardware computer system, a contour of a feature of the pattern based on value of the variable selected from a substrate location within the fingerprint.

According to an embodiment, the predicting comprises using the value of the variable to select a nominal contour of a certain shape for the feature.

According to an embodiment, the nominal contour is obtained by calculation using a simulation or mathematical model.

According to an embodiment, the nominal contour is a contour as expected in resist.

According to an embodiment, the predicting comprises changing a size of a nominal contour for the feature.

According to an embodiment, the changing the size is based on a value of a further variable associated with the pattern, the value selected at the same substrate location from an across substrate fingerprint of the further variable.

According to an embodiment, the across substrate fingerprint of the further variable corresponds to a situation post-etch.

According to an embodiment, the further variable comprises critical dimension.

According to an embodiment, the variable comprises focus.

According to an embodiment, the feature is a determined hot spot.

According to an embodiment, the method further comprises using the predicted contour to determine an edge placement position or error.

According to an embodiment, the method further comprises using a check against the predicted contour to determine whether the feature or another feature is likely to be defective.

According to an embodiment, the method further comprises using the predicted contour to calibrate a mathematical model.

According to an embodiment, the mathematical model comprises an optical proximity correction model.

Disclosed herein is a computer program product comprising a non-transitory computer readable medium having instructions recorded thereon, the instructions when executed by a computer implementing any of the methods herein.

BRIEF DESCRIPTION OF THE DRAWINGS

FIGS. 20A, 20B and 20C schematically depict an embodiment of a defect analysis process.

FIGS. 21A, 21B and 21C schematically depict an embodiment of a defect analysis process.

DETAILED DESCRIPTION

Figure 1:
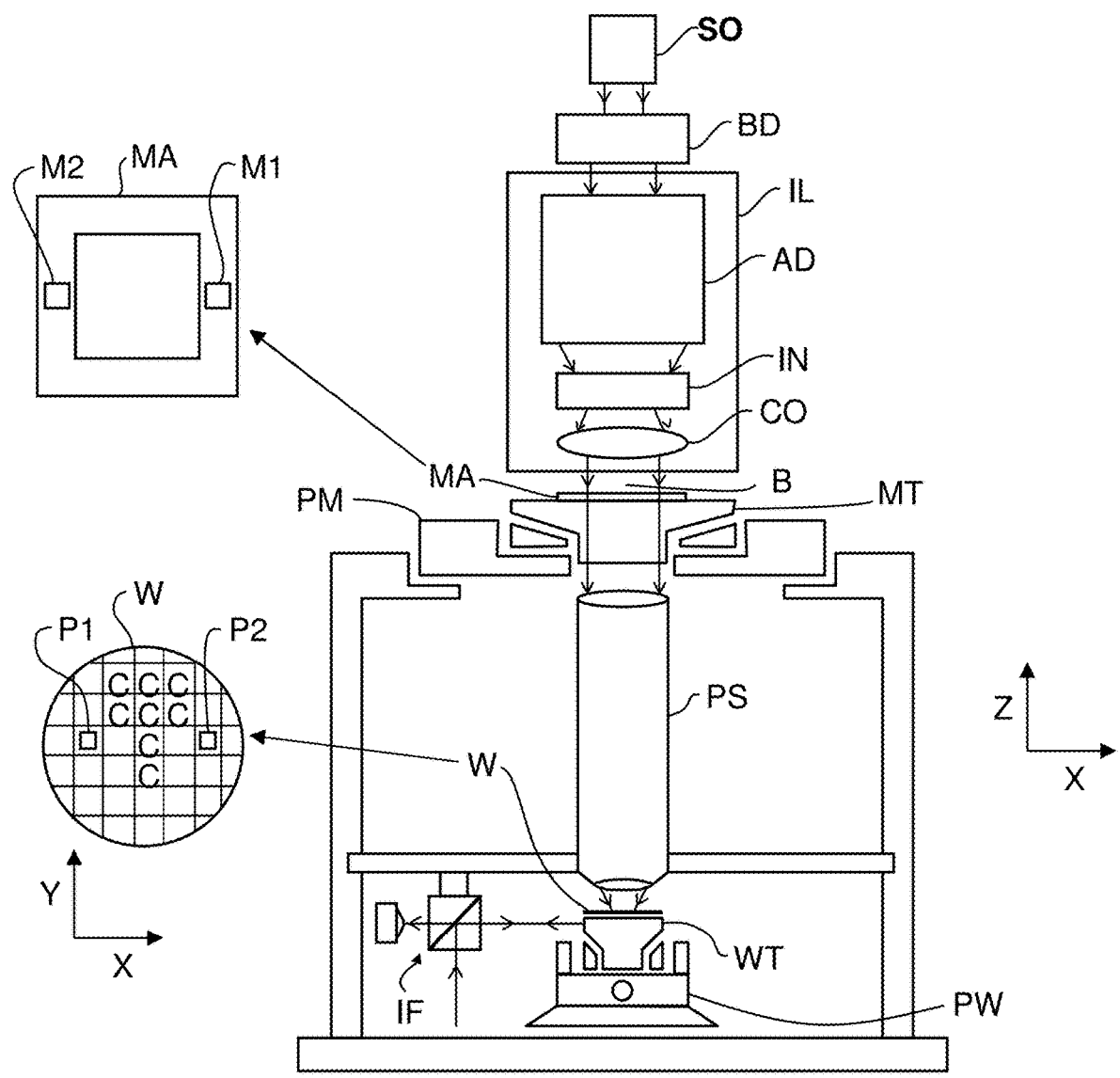
FIG. 1 schematically depicts a lithography apparatus according to an embodiment.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens."

FIG. 1 schematically depicts a lithography apparatus according to an embodiment. The apparatus comprises:

an illumination system (illuminator) IL to condition a beam PB of radiation (e.g. UV radiation or DUV radiation).

a support structure MT to support a patterning device (e.g. a mask) MA and connected to first positioning device PM to accurately position the patterning device with respect to item PS;

a substrate table (e.g. a wafer table) WT for holding a substrate (e.g. a resist coated wafer) W and connected to second positioning device PW for accurately positioning the substrate with respect to item PS; and a projection system (e.g. a refractive projection lens) PS configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithography apparatus may be separate entities, for example when the source is an excimer laser. In such cases, the source is not considered to form part of the lithography apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjuster AM configured to adjust the intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the projection system PS, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PL in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used. The projection system PS may comprise a plurality of optical (e.g., lens) elements and may further comprise an adjustment mechanism PA configured to adjust one or more of the optical elements so as to correct for aberrations (phase variations across the pupil plane throughout the field). To achieve this, the adjustment mechanism PA may be operable to manipulate one or more optical (e.g., lens) elements within the projection system PS in one or more different ways. The projection system may have a co-ordinate system wherein its optical axis extends in the z direction. The adjustment mechanism PA may be operable to do any combination of the following: displace one or more optical elements; tilt one or more optical elements; and/or deform one or more optical elements. Displacement of optical elements may be in any direction (x, y, z or a combination thereof). Tilting of optical elements is typically out of a plane perpendicular to the optical axis, by rotating about axes in the x or y directions although a rotation about the z axis may be used for non-rotationally symmetric aspherical optical elements. Deformation of optical elements may include both low frequency shapes (e.g. astigmatic) and high frequency shapes (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodizations (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodizations.

Figure 2:
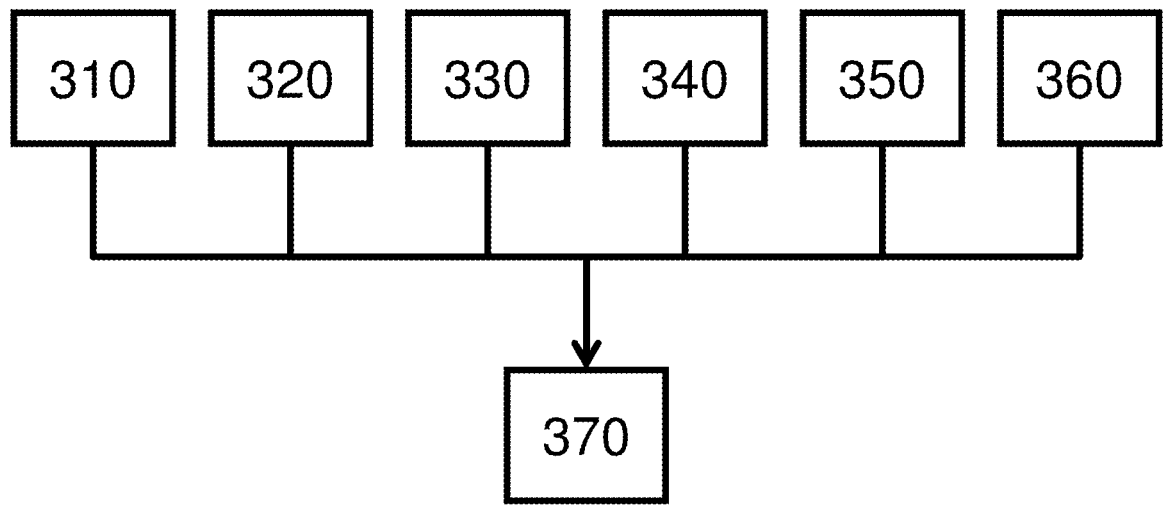
FIG. 2 shows example categories of the processing variables.

Variables of the patterning process are called "processing variables." The patterning process may include processes upstream and downstream to the actual transfer of the pattern in a lithography apparatus. FIG. 2 shows example categories of the processing variables 370. The first category may be variables 310 of the lithography apparatus or any other apparatuses used in the lithography process. Examples of this category include variables of the illumination, projection system, substrate stage, etc. of a lithography apparatus. The second category may be variables 320 of one or more procedures performed in the patterning process. Examples of this category include focus control or focus measurement, dose control or dose measurement, bandwidth, exposure duration, development temperature, chemical composition used in development, etc. The third category may be variables 330 of the design layout and its implementation in, or using, a patterning device. Examples of this category may include shapes and/or locations of assist features, adjustments applied by a resolution enhancement technique (RET), CD of mask features, etc. The fourth category may be variables 340 of the substrate. Examples include characteristics of structures under a resist layer, chemical composition and/or physical dimension of the resist layer, etc. The fifth category may be characteristics 350 of temporal variation of one or more variables of the patterning process. Examples of this category include a characteristic of high frequency stage movement (e.g., frequency, amplitude, etc.), high frequency laser bandwidth change (e.g., frequency, amplitude, etc.) and/or high frequency laser wavelength change. These high frequency changes or movements are those above the response time of mechanisms to adjust the underlying variables (e.g., stage position, laser intensity). The sixth category may be characteristics 360 of processes upstream of, or downstream to, pattern transfer in a lithographic apparatus, such as spin coating, post-exposure bake (PEB), development, etching, deposition, doping and/or packaging.

The values of some or all of the processing variables may be determined by a suitable method. For example, the values may be determined from data obtained with various metrology tools (e.g., a substrate metrology tool). The values may be obtained from various sensors or system of an apparatus in the patterning process (e.g., a sensor, such as a leveling sensor or alignment sensor, of a lithography apparatus, a control system (e.g., a substrate or patterning device table control system) of a lithography apparatus, a sensor in a track tool, etc.). The values may be from an operator of the patterning process.

A processing variable may be "modelable" or "unmodeled." A processing variable being modelable means that a contribution of a change of the processing variable (e.g., focus, dose, etc.) to metrology data can be determined by a computational model or is determined by a computational model. A simple example is that the contribution of a change of a modelable processing variable is the product of the change and a sensitivity of the metrology data with respect to the modelable processing variable. Non-limiting examples of the metrology data may include a critical dimension (CD), critical dimension uniformity (CDU), sidewall angle, edge position, overlay, focus, pattern shift, etc. The metrology data may be the values of a characteristic of individual patterns or a statistic (e.g., the mean) of the characteristic of a group of patterns. A processing variable being unmodeled means that a contribution of a change of the processing variable (e.g., development, etching, etc.) to metrology data is not computationally modeled at the appropriate time or because it cannot be determined by, or not accurately determined by, a computational model. A processing variable may be unmodeled because of lack of knowledge on how it impacts the metrology data. For example, some processing variables in the fourth category (e.g., the composition of the resist layer) and some processing variables in the sixth category (e.g., characteristics of PEB, development, etching, deposition, or doping) may not have a fully-understood relationship yet with the metrology data and thus contributions of their changes to the metrology data are not readily determinable by computational modeling. A processing variable may be unmodeled because its value is not known. A processing variable being unmodeled does not necessarily mean that computational modeling that processing variable is impossible. A processing variable may be unmodeled because the relationship between the processing variable and the metrology data is not yet understood.

Figure 3A:
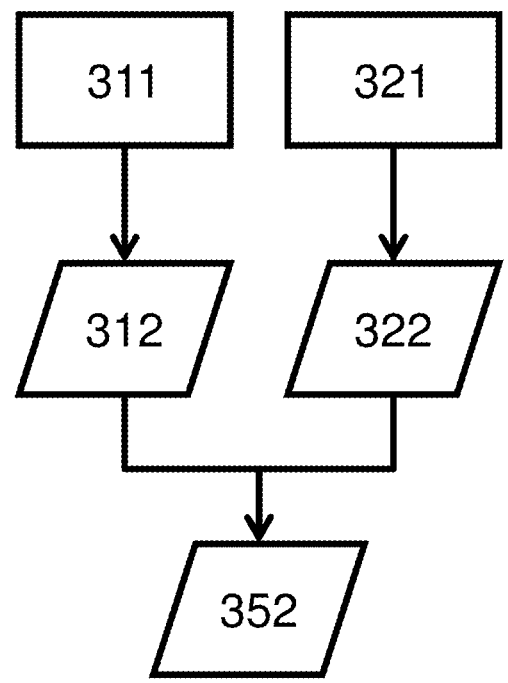
FIG. 3A schematically shows that a change of a modelable processing variable and a change of an unmodeled processing variable may both have contributions to the metrology data.

FIG. 3A schematically shows that a change of a modelable processing variable 311 may have a contribution 312 to the metrology data 352 of a pattern on a substrate (e.g., the metrology data can determined CD, overlay error, focus, dose, etc.) and that a change of an unmodeled processing variable 321 may have a contribution 322 to the metrology data 352. Namely, the metrology data 352 may have combined contributions of changes of both a modelable processing variable and an unmodeled processing variable. These contributions 312 and 322 may be simply additive (which may include weighted addition) or be combined by other functions (e.g., convolution). The metrology data 352 may have contributions of changes in other variables, which may be modelable or unmodeled. For example, the modelable processing variable 311 may be focus used in exposure of the pattern. The impact of focus changes on the pattern and hence metrology data of the pattern is usually known and can be predicted by modeling. The unmodeled processing variable 321 may be a setting (e.g., a heater setpoint) in an etch chamber used to etch the substrate to form the pattern. The impact of change of an etching setting on the pattern and hence metrology data of the pattern may not be fully known yet and the impact may not be determined by modeling.

Figure 3B:
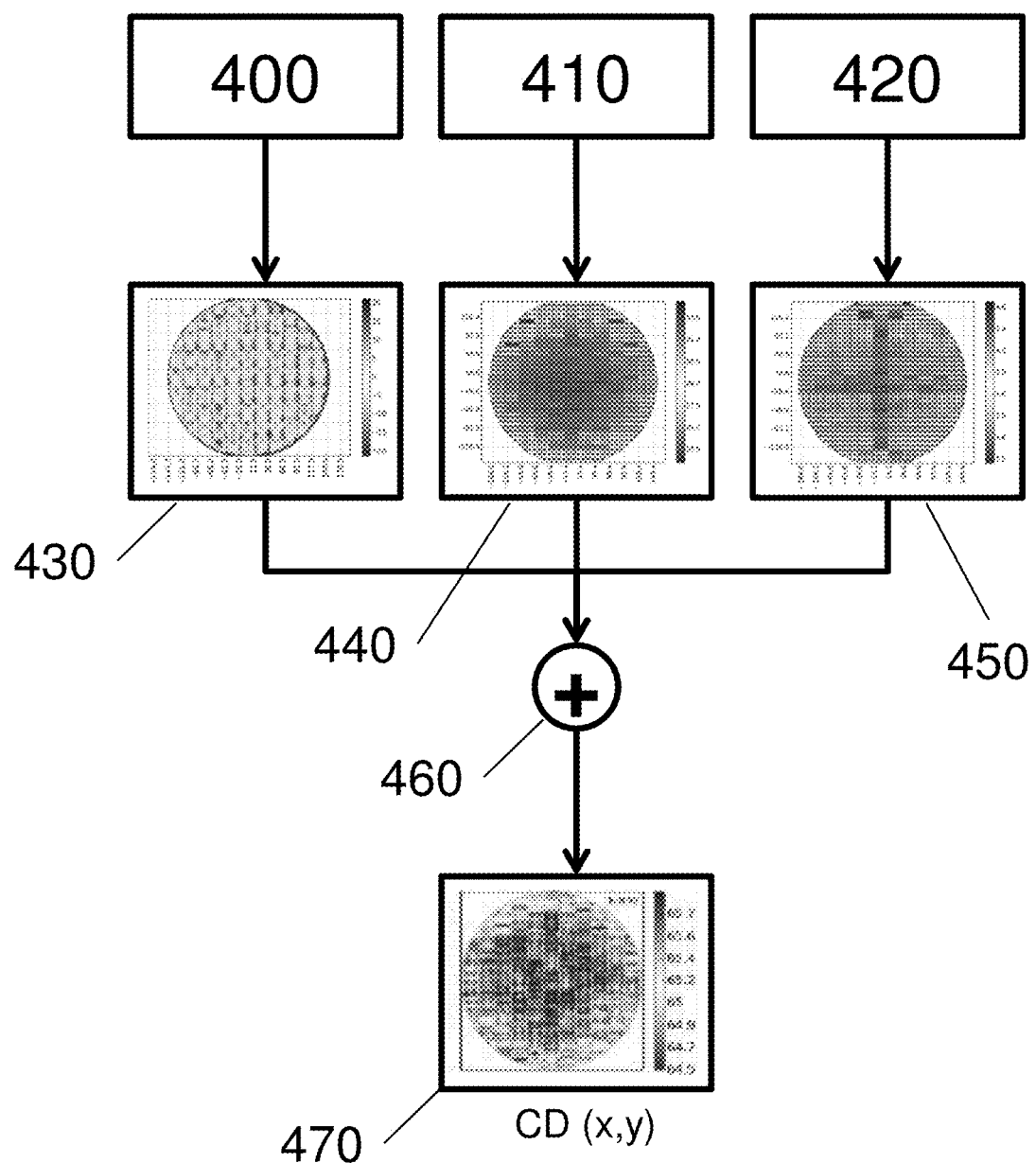
FIG. 3B schematically shows an example of modeling a combined contribution to CD on a substrate, the contribution being of changes of multiple modelable processing variables.

FIG. 3B schematically shows an example of modeling a combined contribution to CD on a substrate, the contribution being of changes (e.g., errors) of multiple modelable processing variables such as focus (F) 400, moving standard deviation ($MSD_z$) 410 of movement of the substrate in the normal direction of the substrate, and moving standard deviation ($MSD_x$) 420 of movement of the substrate in a direction parallel to the substrate. So, in this example, an example of the contribution to CD of focus (F) 400 is shown as contribution 430, an example of the contribution to CD of moving standard deviation ($MSD_z$) 410 is shown as contribution 440, and an example of the contribution to CD of moving standard deviation ($MSD_x$) 420 is shown as contribution 440. Each of these contributions is then combined together 460. While element 460 (and other elements in the Figures) shows a plus sign, the operation at 460 need not be addition, e.g., it can be a multiplication, convolution, etc. In an example, the combined contribution is expressed as $$CD(x,y) = a_1 * CD(F)^2(x,y) + b_1 * CD(MSD_x)(x,y) + c_1 * CD(MSD_z)(x,y) +$$

In an embodiment, the contributions 430, 440, 450 may be respectively focus (F) 400, moving standard deviation ($MSD_z$) 410 and moving standard deviation ($MSD_x$) 420 distributions in which case a CD model would be used to combine them into a CD distribution. Moreover, there may be cross terms that are not shown here (such as CD as a function of F times MSD, etc.). To obtain an absolute value of CD, a nominal value or simulated value of the CD can be combined with the contributions. The coefficients such as $a_1$, $b_1$, $c_1$ are sensitivities of the metrology data CD with respect of the modelable processing variables or their functions. MSD is the moving standard deviation (MSD) of the positioning error of the substrate during pattern transfer in the lithographic apparatus and thus represents the high-frequency part of the positioning error. In this example, the contributions are across a substrate but in an embodiment, one or more of the contributions may per die/field (which could then be repeated across the substrate depending on, e.g., applicable conditions at each of the instances). The contribution (or its translation into an absolute value) may be characterized as a fingerprint since it can be spatially defined across the substrate/die/field.

Figure 4A:
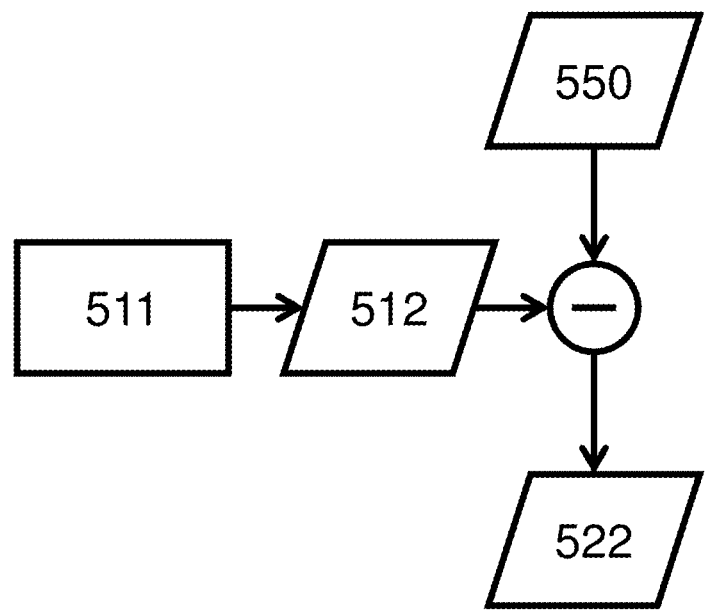
FIG. 4A schematically shows metrology data having two contributions, one of which is from changes of one or more modelable processing variables and the other of which is from changes of one or more other processing variables, which may be unmodeled, modelable, or a mixture thereof.

FIG. 4A schematically shows that metrology data 550 have two contributions 512 and 522. Contribution 512 is from changes of one or more modelable processing variables 511. Contribution 522 is from changes of one or more other processing variables, which may be unmodeled, modelable, or a mixture thereof. The contribution 522 may be obtained by removing the contribution 512 from the metrology data 550. By definition, the contribution 512 may be determined by modeling the one or more modelable processing variables 511. The contribution 512 may be expressed as a function of the one or more modelable processing variables 511. The function may be linear or non-linear.

Figure 4B:
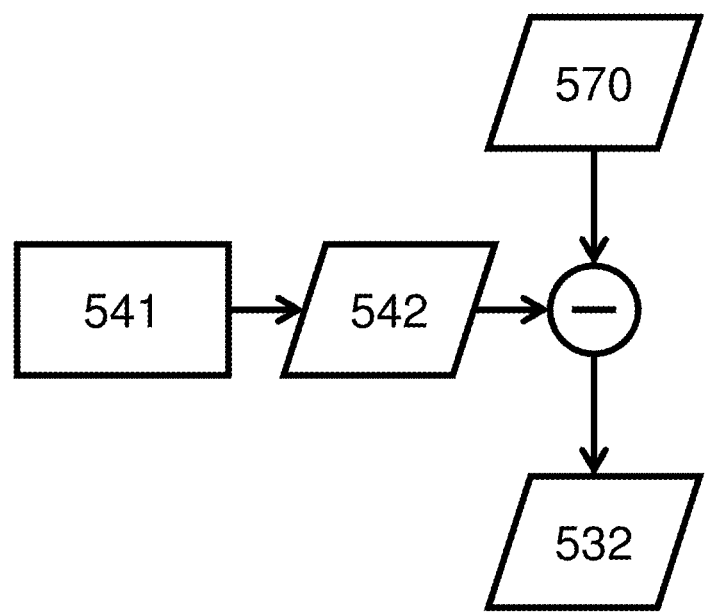
FIG. 4B schematically shows metrology data having two contributions, one of which is from changes of one or more unmodeled processing variables and the other of which is from changes of one or more other processing variables, which may be unmodeled, modelable, or a mixture thereof.

FIG. 4B schematically shows that metrology data 570 having two contributions 542 and 532. Contribution 542 is from changes of one or more unmodeled processing variables 541. Contribution 532 is from changes of one or more other processing variables, which may be unmodeled, modelable, or a mixture thereof. The contribution 532 may be obtained by removing the contribution 542 from the metrology data 570. The contribution 542 may be determined experimentally or empirically although the one or more processing variables 541 are not modelable.

The contribution of one or more modelable variables may be lithographic apparatus specific; that is, the contribution of one or more modelable variables is specific to a certain actual lithographic apparatus. In an embodiment, the contribution of one or more modelable variables is not specific to a particular substrate (and so can be used across substrates). Thus, the contribution of one or more modelable variables may be pre-characterized and obtained from a database later for various combination processes. This contribution of one or more modelable variables can be applied to a specific substrate by combining it with data of the one or more variables for the specific substrate and a sensitivity relationship. The contribution of one or more modelable variables may be substrate specific. For example, the contribution may be determined for each substrate or a specific group of substrates. Examples of such variables may include, but is not limited to, variables of the illumination, projection system, focus, dose, bandwidth, exposure duration, a characteristic of high frequency stage movement (e.g., moving standard deviation (MSD) of movement of the substrate stage, moving average of the movement of the substrate stage, etc.), a high frequency laser bandwidth change (e.g., frequency, amplitude, etc.), a high frequency laser wavelength change, and/or flatness of the substrate.

The contribution of one or more modelable variables may be pattern or patterning device specific; that is, the contribution is specific to a certain actual patterning device or specific pattern to be provided by a patterning device. This contribution can be further substrate independent. Thus, the pattern or patterning device specific contribution may be pre-characterized and obtained from a database later for various combination processes. Examples of such variables may include, but is not limited to, mask CD, a shape and/or location of an assist feature, an adjustment applied by a resolution enhancement technique (RET), etc.

The contribution of one or more unmodeled variables may be substrate independent or substrate dependent. In an embodiment, the contribution of one or more unmodeled variables may be used repeatedly across every substrate. Therefore, the contribution of one or more unmodeled variables may be pre-characterized and obtained from a database for various combination processes. The contribution of one or more unmodeled variables may be apparatus specific (as a whole or specific part (e.g., etch chamber) of the apparatus). Examples of such variables may include, but is not limited to, various characteristics of a process upstream or downstream to pattern transfer in the lithographic apparatus, such as spin coating, PEB, development, etching, deposition, doping, and/or packaging.

The contribution of change of different processing variables may have different spatial uniformity across the substrate. For example, the contribution of change of one or more unmodeled processing variables may be essentially uniform across the entire substrate, while the contribution of change of one or more modelable processing variables may be not so uniform across the entire substrate. This difference may be attributed to the different nature of the processing variables. For example, the contribution of change of one or more processing variables associated with the resist layer, development of the resist layer, and/or etching of the substrate tend to be essentially uniform because the entire substrate is usually coated with the resist layer, developed or etched at a same time and under a same condition, or tends to be rotationally symmetric because of the rotation of the substrate during a number of these processes. For example, the contribution of change of one or more processing variables associated with the exposure or the lithography apparatus tends to be less uniform because exposure tends to be done die by die and the one or more processing variables may change between exposure of a die and exposure of another die. Therefore, if the contribution that is not essentially uniform across the substrate can be removed from the metrology data of a pattern, a contribution essentially uniform across the substrate can be obtained from the metrology data for this pattern and patterns at other locations on the substrate.

So, in a specific example, data can be gathered from the lithographic apparatus for each point exposed on the wafer, such as leveling information, moving average (MA) of movement of the substrate, MSDxyz, dose, laser bandwidth, pupil shape, etc. This data is typically already available in a lithographic apparatus, e.g., in diagnostic files. From this data, the contribution described above (which can also be described as a virtual substrate or substrate fingerprint where the contribution is spatially distributed across the substrate) can be generated using a CD model and CDU sensitivities of the features of interest (where CD is the metrology variable desired to be evaluated). The sensitivities can be obtained from simulation or from experiments. The contribution generated in this fashion is what would be expected to be seen during a measurement after resist development, assuming the track and resist model calibration would be perfect. Once the substrate is measured, e.g., after develop or after etch, the contribution (e.g., virtual substrate or virtual fingerprint) is removed from the comparable measurements (e.g., CDU measurement). The remaining contribution (e.g., fingerprint) is now the contribution by the pre- or post-pattern transfer process (e.g., by the track and/or etch apparatus, which is generally interfield) and the patterning device (intrafield). The lithographic apparatus errors would have been corrected from the measured data. Similarly, the patterning device contribution may be measured and its contribution removed to leave the contribution by the pre- or post-pattern transfer processes.

Thus, a contribution can be removed per process flow (e.g., a combination of patterning parameters and/or apparatus used) or per particular apparatus or part thereof (e.g., etch apparatus or etch chamber). For an intrafield fingerprint, when cleaned up from lithographic apparatus disturbances and/or systematics represented in its contribution, it should be possible to get much better correlation of patterning device versus substrate measurements.

Further, removal of, e.g., a lithographic apparatus contribution, can result in a significant reduction in feature to feature delta fingerprints. This can be useful when a fingerprint measured on one feature is used for defect prediction of another feature (e.g., this would be useful where measurement is taken of a target feature (e.g., a grating) rather than a functional device feature so that such measurement can be used to predict defects of the pattern feature where the pattern feature itself is not, or may not be, measured).

Figure 5:
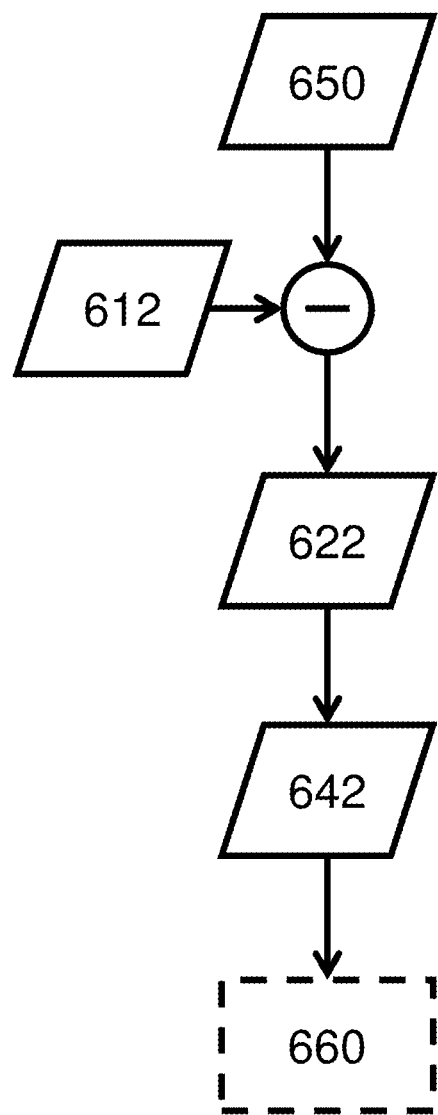
FIG. 5 schematically shows a flow for a method, according to an embodiment.

So, removal of, e.g., a lithographic apparatus contribution, can make measurement results less noisy (because lithographic apparatus variation is corrected), make measurement of non-lithographic apparatus fingerprints more accurate, and/or make measurements more suitable for troubleshooting lithographic apparatus fingerprints for which the cause is unknown FIG. 5 schematically shows a flow for a method, according to an embodiment. Contribution 612 of change of a first group of one or more processing variables are removed from metrology data 650 of a first pattern on a substrate, thereby obtaining contribution 622 of change of a second group of one or more processing variables to the metrology data 650, where, for example, the contribution 622 has higher spatial uniformity than the contribution 612. Contribution 642 of change of the second group of one or more processing variables to metrology data of a second pattern on the same or different substrate can be obtained based on the contribution 622, without the need of actually obtaining the metrology data from the second pattern. For example, the contribution 642 may be estimated to be the same as the contribution 622 because change of the second group of one or more processing variables causes a contribution with high spatial uniformity to metrology data. In optional procedure 660, the probability of a defect at the second pattern may be reduced by adjusting one or more processing variables of the first group of one or more processing variables based on the contribution 642, without performing metrology on the second pattern. In an example, the first pattern may be a pattern for testing purpose (i.e., a target) and performing metrology on the first pattern does not impact a functional pattern on the substrate; the second pattern is one or more functional patterns, and performing metrology on the second pattern thus may negatively impact it and should be avoided. This flow in FIG. 5 provides a way to obtain at least impact on the second pattern by some processing variables (i.e., the second group here) without performing metrology on the second pattern. In an example, the first group of one or more processing variables may include the focus, dose, substrate positioning and/or other variables of the lithography apparatus during exposure of the substrate. Because the first pattern and the second pattern may not be exposed at the same time, these variables (e.g., their values) may be different for the first pattern and the second pattern. The second group of one or more processing variables may include PEB temperature and/or duration, developer concentration and/or duration, etch rate, etc. that are substantially uniform across the entire substrate. Because the second group of one or more processing variables is applied to the entire substrate (e.g., the entire substrate is subject to the same baking and development conditions), their impact on the first pattern and the second pattern tend to be similar.

Figure 6:
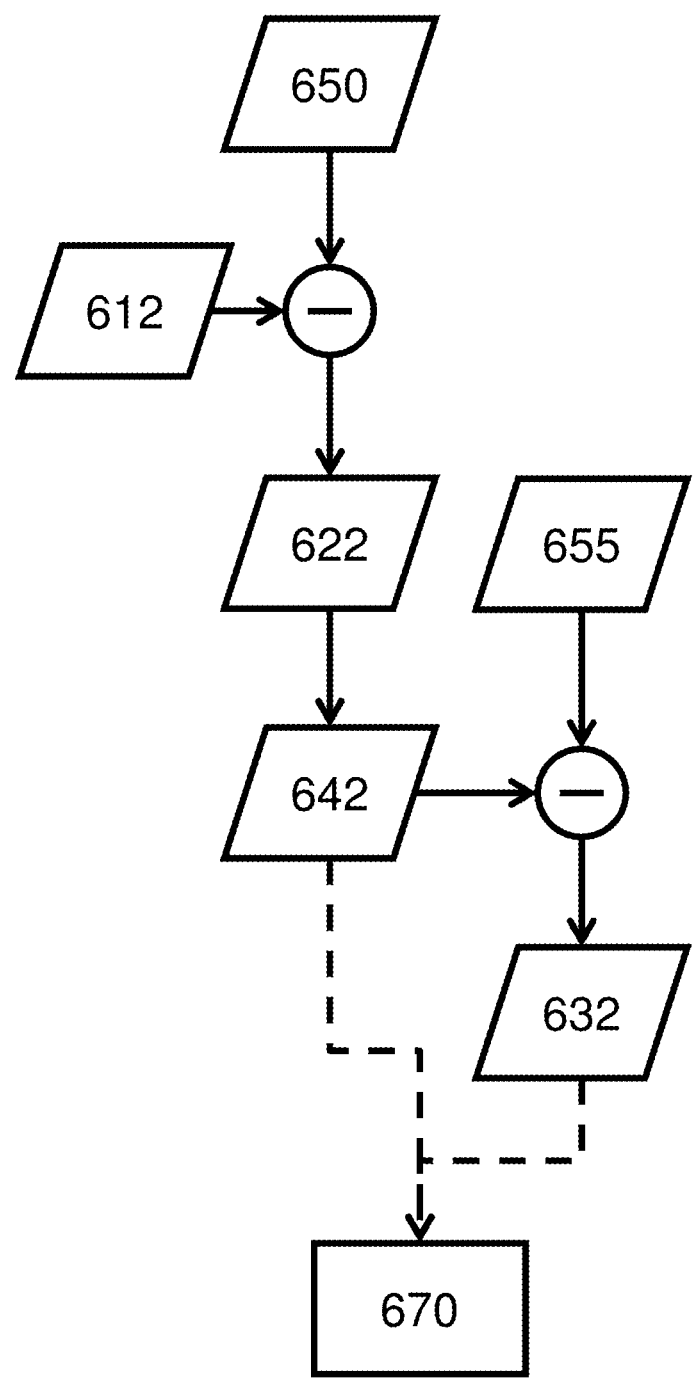
FIG. 6 schematically shows a flow for a method, according to an embodiment.

FIG. 6 schematically shows a flow for a method, according to an embodiment. Contribution 612 of change of a first group of one or more processing variables is removed from metrology data 650 of a first pattern on a substrate, thereby obtaining contribution 622 of change of a second group of one or more processing variables to the metrology data 650, where the contribution 622 has, e.g., higher spatial uniformity than the contribution 612. Contribution 642 of change of the second group of one or more processing variables to metrology data 655 of a second pattern on the substrate may be obtained based on the contribution 622. For example, the contribution 642 may be estimated to be the same as the contribution 622 because change of the second group of one or more of processing variables causes a contribution with high spatial uniformity to metrology data. Contribution 642 of change of the second group of one or more of processing variables can then be removed from the metrology data 655 (e.g., actual measured data of the second pattern after the processing involving the first and second groups of processing variables), thereby obtaining contribution 632 of change of the first group of one or more of processing variables to the metrology data 655, without actually obtaining the values of the first group of one or more of processing variables at the second pattern. In procedure 670, the probability of a defect at the second pattern may be reduced by adjusting one or more of the variables of the first group of one or more of processing variables based on the contribution 632, the contribution 642 or a combination thereof. This flow in FIG. 6 is another use of the estimation of the contribution 642 when the metrology data on the second pattern are available. In an example, the first group of one or more of processing variables may include the focus, dose, substrate positioning and/or other variables of the lithography apparatus during exposure of the substrate; the second group of one or more of processing variables may include PEB temperature and/or duration, developer concentration and/or duration, etch rate, etc. that are, e.g., substantially uniform across the entire substrate.

Various patterns on or provided by a patterning device may have different process windows. i.e., a space of processing variables under which a pattern will be produced within specification. Examples of pattern specifications that relate to potential systematic defects include checks for necking, line pull back, line thinning, CD, edge placement, overlapping, resist top loss, resist undercut and/or bridging. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. When controlling a patterning process, it is possible and economical to focus on the hot spots. When the hot spots are not defective, it is most likely that all the patterns are not defective.

From a mathematical point of view, a process window is a region in a vector space spanned by all the processing variables. In a given patterning process, the process window of a pattern is dictated only by the specifications of the pattern and the physics involved in the patterning process. Namely, if the specifications and the physics do not change during the patterning process, the process window does not change.

However, some of the processing variables may be unmodeled and thus the boundaries of the values of these unmodeled processing variables that the specifications of one or more patterns dictate may not be obtained by modeling. Therefore, using a region in a vector space spanned by all the processing variables as the process window may not be convenient. A region of a subspace (i.e., a space spanned by fewer than all the processing variables) ("sub-PW") may be used instead of the region spanned by all the processing variables ("full PW"). For example, in a patterning process with many processing variables, a region of the subspace spanned by focus and dose may be used as a sub-PW. The processing variables spanning the subspace may be all modelable. When those processing variables not spanning a sub-PW include one or more unmodeled processing variables, the sub-PW may become smaller because the values of the processing variables spanning the sub-PW have to be those that make the pattern within specification, at any possible value of the one or more unmodeled processing variables. In an example, the processing variables not spanning the sub-PW may include one or more unmodeled processing variables such as a characteristic of structures under a resist layer, a chemical composition and/or physical dimension of the resist layer, and/or a characteristic of one or more processes upstream, or downstream, to the pattern transfer in a lithography apparatus, such as spin coating, PEB, development, etching, deposition, doping and/or packaging. Because such a variable is unmodeled, its impact on the metrology data is difficult to determine.

Figure 7A:
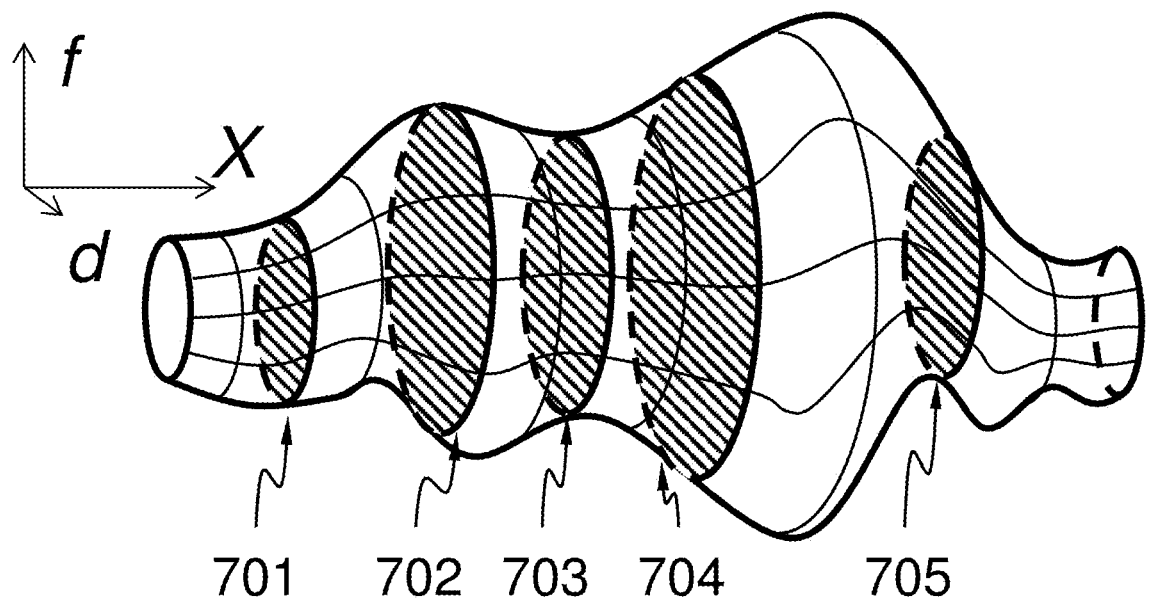
FIG. 7A and FIG. 7B schematically show the impact of an unmodeled processing variable on a sub-PW.
Figure 7B:
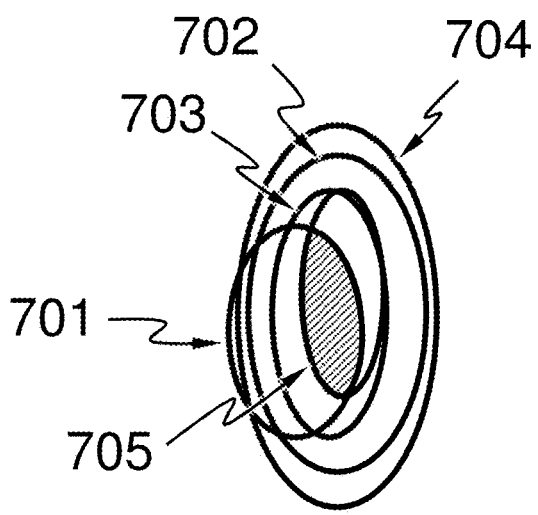

FIG. 7A and FIG. 7B schematically show the impact of one or more unmodeled processing variables on a sub-PW. For convenience, the PW is depicted in FIG. 7A as a region of a three-dimensional (e.g., focus (f), dose (d), and another processing variable X that is unmodeled) space although the PW may actually have other dimensions. Sub-PWs spanned by two of the processing variables—focus (f) and dose (d)—are shown as cross-sections (e.g., cross-sections 701-705) of the PW. FIG. 7B schematically shows that if the possible values of X are between cross-sections 701 and 705, the sub-PW spanned by f and d is the shaded area that is the overlap of all the cross-sections between cross-sections 701 and 705 because values of f and d within the shaded area will ensure the pattern is within specification at any values of X between cross-sections 701 and 705. Examples of the unmodeled processing variable X may include a characteristic of structures under a resist layer, chemical composition and/or physical dimension of the resist layer, and/or a characteristic of one or more processes upstream, or downstream, to the pattern transfer in a lithography apparatus, such as spin coating, PEB, development, etching, deposition, doping and/or packaging.

Figure 8:
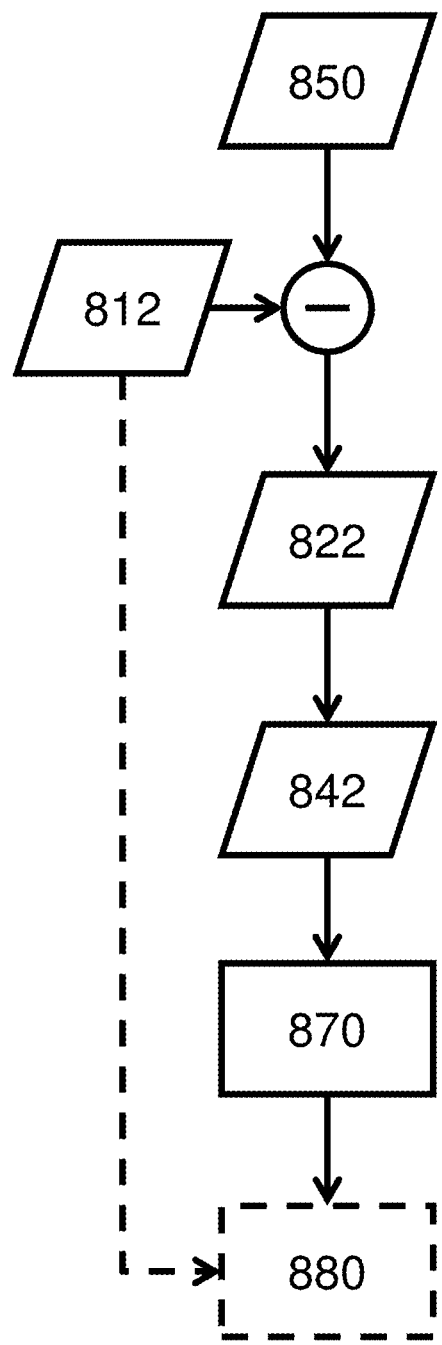
FIG. 8 schematically shows a flow for a method, according to an embodiment.

FIG. 8 schematically shows a flow for a method, according to an embodiment. Contribution 812 of change of a first group of one or more of processing variables are removed from metrology data 850 of a first pattern, thereby obtaining contribution 822 of change of a second group of one or more of processing variables to the metrology data 850. The first group includes all modelable processing variables; the second group includes all unmodeled processing variables. Contribution 842 of change of the second group of one or more of processing variables to metrology data of a second pattern on the substrate may be obtained based on the contribution 822. The metrology data of the second pattern does not have to be available to obtain the contribution 842. For example, the contribution 842 may be estimated to be the same as the contribution 822 when change of the second group of one or more of processing variables causes a contribution with high spatial uniformity to metrology data. In procedure 870, the sub-PW spanned by the first group of processing variables for the second pattern is obtained based on the contribution 842. In optional procedure 880, the values of one or more of the processing variables of the first group of processing variables may be adjusted to decrease the probability of a defect at the second pattern based on the sub-PW (and optionally in addition with the contribution 812). The sub-PW may be used to determine whether a defect exists at the second pattern based on values of the first group of processing variables. Examples of processing variables in the second group may include a characteristic of structures under a resist layer, chemical composition and/or physical dimension of the resist layer, and/or a characteristic of one or more processes upstream, or downstream, to the pattern transfer in a lithography apparatus, such as spin coating, PEB, development, etching, deposition, doping and/or packaging. Examples of processing variables in the first group may include a variable of the illumination, projection system, substrate stage, etc. of a lithography apparatus, focus, dose, bandwidth, exposure duration, a shape and/or location of an assist feature, an adjustment applied by a resolution enhancement technique (RET), a characteristics of high frequency stage movement (e.g., frequency, amplitude, etc.), a high frequency laser bandwidth change (e.g., frequency, amplitude, etc.) and/or high frequency laser wavelength change.

Figure 9:
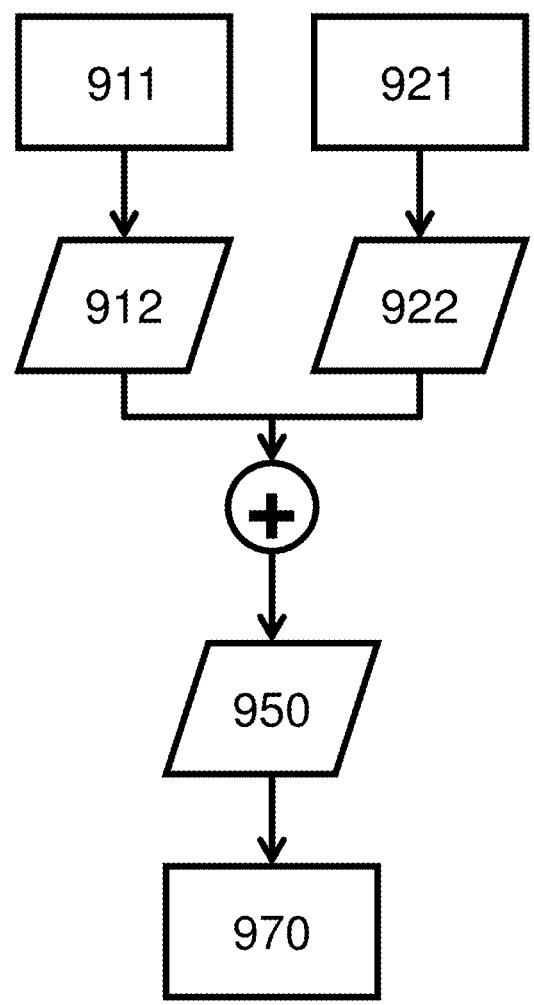
FIG. 9 schematically shows a flow for a method, according to an embodiment.

FIG. 9 schematically shows a flow for a method, according to an embodiment. Contribution 912 of change of a first group of one or more modelable processing variables 911 to metrology data of, e.g., a hot spot are determined, e.g., by modeling. A contribution 922 of change of a second group of one or more unmodeled processing variables 921 is obtained. The contribution 922 may be obtained by experimentation and may be obtained from a database. The contribution 922 may be obtained using, e.g., the flow of obtaining the contribution 642 in FIG. 6 (namely the contribution 922 may be obtained based on contribution of change of the second group of one or more processing variables to metrology data of a different pattern from the hot spot). The contribution 912 may be determined for every substrate while the contribution 922 may be used repeatedly across many substrates. The contribution 912 and the contribution 922 are combined to obtain an estimate 950 of the metrology data of the hot spot, without actually performing metrology on the hot spot. In procedure 970, whether there is a defect at the hot spot is determined based on the estimate of the metrology data. Examples of processing variables in the second group may include a characteristic of structures under a resist layer, chemical composition and/or physical dimension of the resist layer, and/or a characteristic of one or more processes upstream, or downstream, to the pattern transfer in a lithography apparatus, such as spin coating, PEB, development, etching, deposition, doping and/or packaging. Examples of processing variables in the first group may include a variable of the illumination, projection system, substrate stage, etc. of a lithography apparatus, focus, dose, bandwidth, exposure duration, a shape and/or location of an assist feature, an adjustment applied by a resolution enhancement technique (RET), a characteristics of high frequency stage movement (e.g., frequency, amplitude, etc.), a high frequency laser bandwidth change (e.g., frequency, amplitude, etc.) and/or high frequency laser wavelength change.

Figure 10:
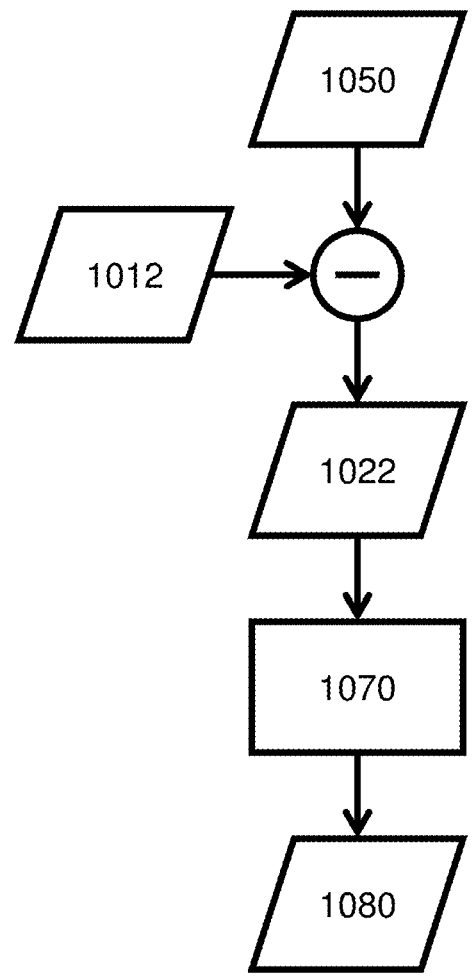
FIG. 10 schematically shows a flow for a method, according to an embodiment.

FIG. 10 schematically shows a flow for a method, according to an embodiment. Contribution 1012 of change of a first group of one or more processing variables is removed from metrology data 1050 of a pattern, thereby obtaining contribution 1022 of change of a second group of one or more processing variables to the metrology data of the pattern. The first group of one or more processing variables includes at least all unmodeled processing variables but may or may not include any modelable processing variables. All the processing variables in the second group of one or more processing variables are modelable. In procedure 1070, one or more parameters of a model for determining the contribution of change of the second group of one or more processing variables to metrology data are fitted against the contribution 1022, thereby obtaining the values 1080 of the one or more parameters of the model. Examples of unmodeled processing variables may include a characteristic of structures under a resist layer, chemical composition and/or physical dimension of the resist layer, and/or a characteristic of one or more processes upstream, or downstream, to the pattern transfer in a lithography apparatus, such as spin coating, PEB, development, etching, deposition, doping and/or packaging. Examples of modelable processing variables may include a variable of the illumination, projection system, substrate stage, etc. of a lithography apparatus, focus, dose, bandwidth, exposure duration, a shape and/or location of an assist feature, an adjustment applied by a resolution enhancement technique (RET), a characteristics of high frequency stage movement (e.g., frequency, amplitude, etc.), a high frequency laser bandwidth change (e.g., frequency, amplitude, etc.) and/or high frequency laser wavelength change.

So, as an example, it is desirable to have a model and any sensitivities represented in the model to adapt to changes in process and/or substrate stack. So, in an embodiment, from lithographic apparatus, a predicted CDU (or overlay) substrate fingerprint for every substrate that will be measured can be generated. For this, a CD model that was established upfront (e.g. during original model calibration) can be used, e.g., $CD = a1*D + a2*F^2 + a3*MSDx + a4*MSDy + a5*MSDz + \ldots$ as described above. Upon measurement of a substrate, the pre- and/or post-process (e.g., track/etch) fingerprint and the patterning device fingerprint can be removed from the measured CD. The remaining CDU fingerprint measurements can be compared to the predicted CD values. In this situation, there are now a set of equations (as many equations as measurement points) where the CD, dose, focus, MSD-xyz, aberrations, etc. are known. This set of equations can be solved for the sensitivities (a1, a2, . . . ) that are desired. When this is performed for a number of substrates measured for a certain product, there will be plenty of data to re-estimate the CD sensitivities desired. If data from multiple lithographic apparatuses are used and/or data from focus exposure matrix exposures are used in the same fashion, sufficient variation in the input signals (e.g., focus, dose, MSD, CD, etc.) can enable proper estimation of sensitivities. Further, the technique can be applied to other metrology data such as depth of focus, exposure latitude, etc.

In an embodiment, a training algorithm could be used to add further accuracy. For example, when the sensitivities for aberration are solved, a boundary condition can be taken into account that the aberration can only vary over the slit and pre-filter the CD (or overlay) data before fitting these sensitivities.

In an embodiment, the sensitivities can become robust against variations in the patterning process by re-assessing them from time to time or continuously.

Figure 11:
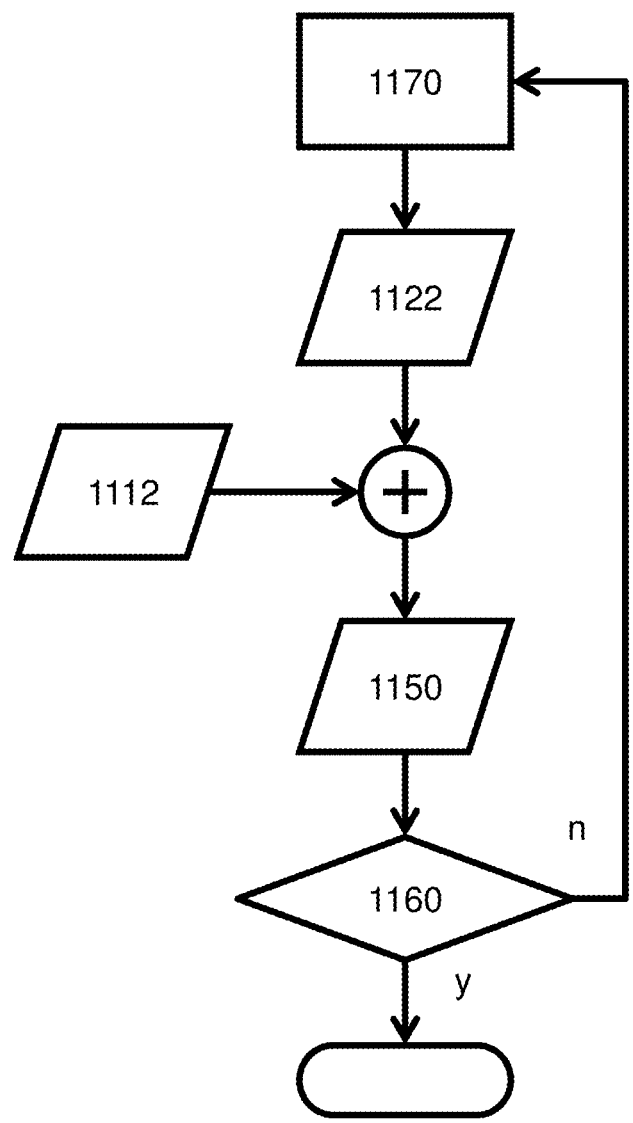
FIG. 11 schematically shows a flow for a method, according to an embodiment.

FIG. 11 schematically shows a flow for a method, according to an embodiment. A contribution 1112 of change of modelable processing variables to metrology data of a pattern and a contribution 1122 of change of unmodeled processing variables to metrology data are combined, thereby obtaining an estimate 1150 of the metrology data. In procedure 1160, it is determined whether the estimate 1150 of the metrology data meets a criterion. If the estimate 1150 does not meet the criterion, an adjustment is made in procedure 1170 to a relationship between the unmodeled processing variables and the contribution 1122. For example, if the unmodeled processing variables include characteristics of the coating process of the resist, adjustment of the relationship may include changing the chemical composition of the resist. For example, if the unmodeled processing variables include characteristics of developing the resist, adjustment of the relationship may include changing the chemical used in the development. For example, if the unmodeled processing variables include characteristics of etching the substrate, adjustment of the relationship may include changing the etching apparatus. This flow may be used to select among several etching apparatuses based on the characteristics of the etching apparatuses and the characteristics of the substrate. For example, the relationship can be established per etching apparatus.

In an embodiment, given the limited possibilities to ensure proper matching of performance between etch chambers and that there will be performance drift over time, CD (or other variable) after etch performance may vary from tool-tool, chamber-chamber. This could cause yield loss. So, CD after etch can be measured to obtain a process fingerprint. This process fingerprint can then be used to predict, based on information available before etching, what the after etch performance will be. If CD is measured both after develop and after etch, a pure etch fingerprint (LEB) can be derived. If a LEB fingerprint is determined for each etcher and/or etch chamber, they can be used to predict for each etcher/etch chamber the after etch CD performance and the after etch defect probability. Then, which etch tool/etch chamber to use to process a substrate (e.g., lot of substrates) can be selected upfront based on minimum defect probability.

Figure 12:
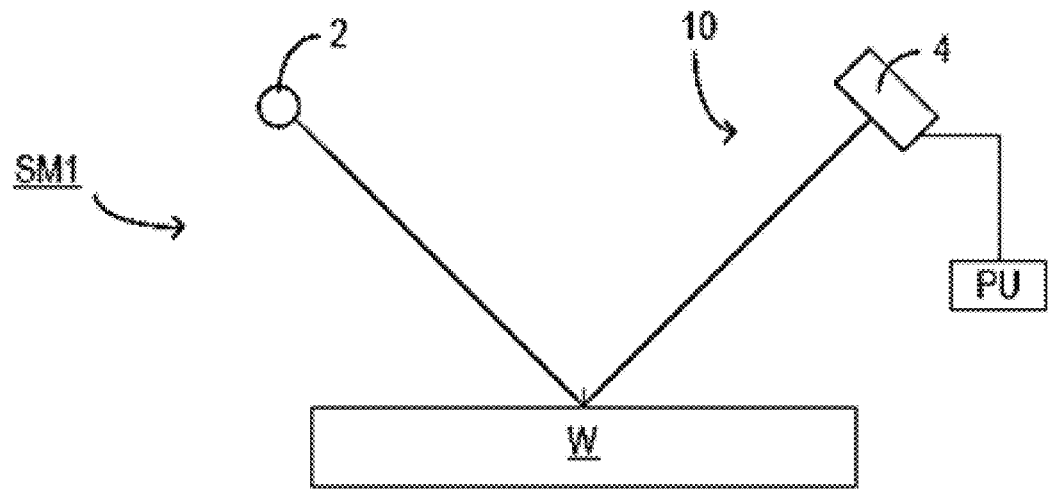
FIG. 12 schematically depicts an example inspection apparatus and metrology technique.
Figure 12:
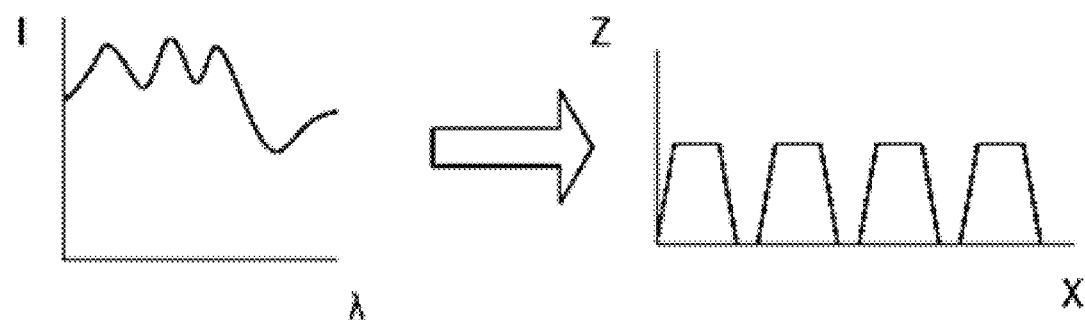

FIG. 12 depicts an example inspection apparatus (e.g., a scatterometer). It comprises a broadband (white light) radiation projector 2 which projects radiation onto a substrate W. The redirected radiation is passed to a spectrometer detector 4, which measures a spectrum 10 (intensity as a function of wavelength) of the specular reflected radiation, as shown, e.g., in the graph in the lower left. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 12. In general, for the reconstruction the general form of the structure is known and some variables are assumed from knowledge of the process by which the structure was made, leaving only a few variables of the structure to be determined from the measured data. Such an inspection apparatus may be configured as a normal-incidence inspection apparatus or an oblique-incidence inspection apparatus.

Figure 13:
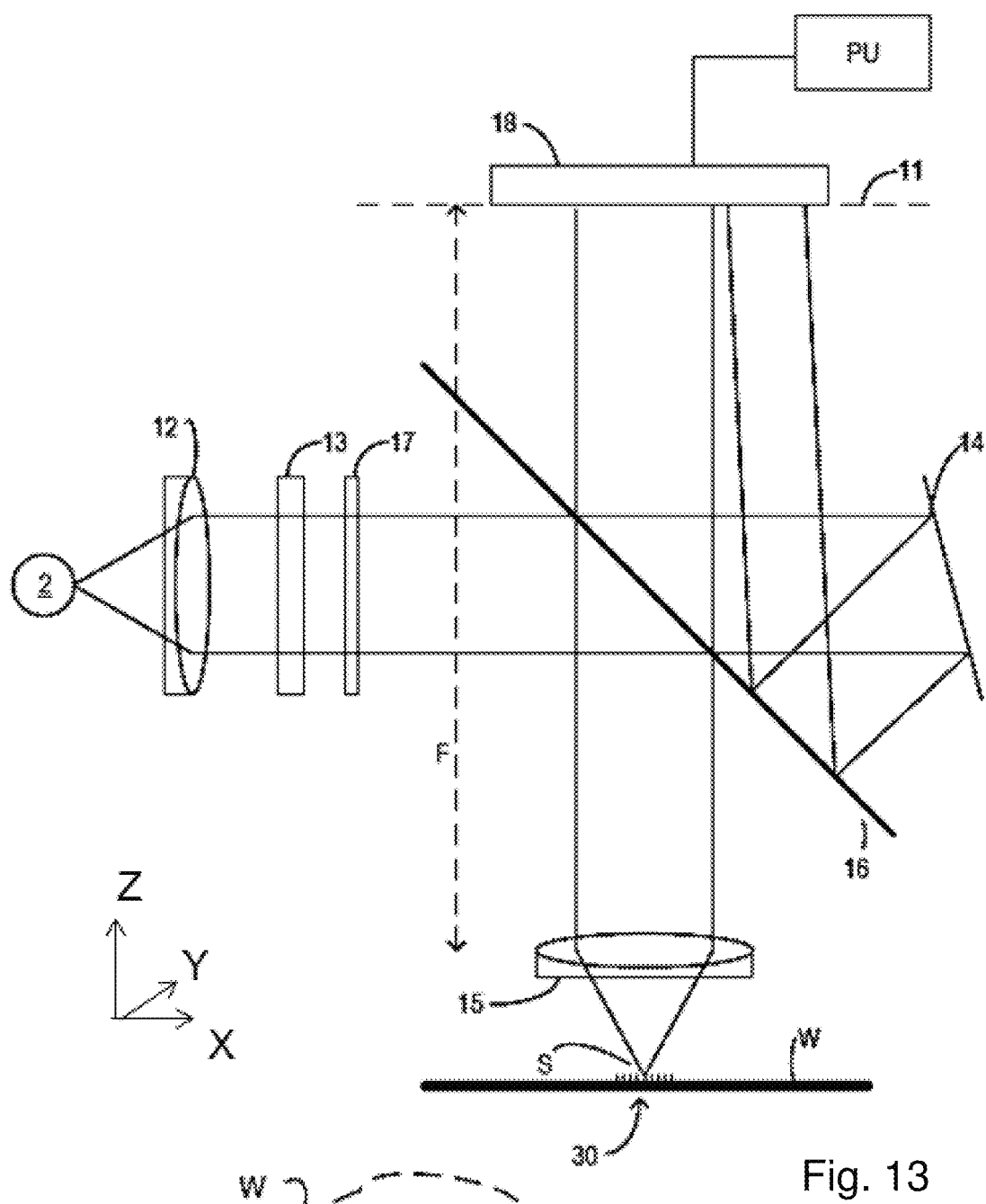
FIG. 13 schematically depicts an example inspection apparatus.

Another inspection apparatus that may be used is shown in FIG. 13. In this device, the radiation emitted by radiation source 2 is collimated using lens system 12 and transmitted through interference filter 13 and polarizer 17, reflected by partially reflecting surface 16 and is focused into a spot S on substrate W via an objective lens 15, which has a high numerical aperture (NA), desirably at least 0.9 or at least 0.95. An immersion inspection apparatus (using a relatively high refractive index fluid such as water) may even have a numerical aperture over 1.

As in the lithographic apparatus LA, one or more substrate tables may be provided to hold the substrate W during measurement operations. The substrate tables may be similar or identical in form to the substrate table WT of FIG. 1. In an example where the inspection apparatus is integrated with the lithographic apparatus, they may even be the same substrate table. Coarse and fine positioners may be provided to a second positioner PW configured to accurately position the substrate in relation to a measurement optical system. Various sensors and actuators are provided for example to acquire the position of a target of interest, and to bring it into position under the objective lens 15. Typically many measurements will be made on targets at different locations across the substrate W. The substrate support can be moved in X and Y directions to acquire different targets, and in the Z direction to obtain a desired location of the target relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and only the substrate moves. Provided the relative position of the substrate and the optical system is correct, it does not matter in principle which one of those is moving in the real world, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

The radiation redirected by the substrate W then passes through partially reflecting surface 16 into a detector 18 in order to have the spectrum detected. The detector 18 may be located at a back-projected focal plane 11 (i.e., at the focal length of the lens system 15) or the plane 11 may be re-imaged with auxiliary optics (not shown) onto the detector 18. The detector may be a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam may be used, for example, to measure the intensity of the incident radiation. To do this, when the radiation beam is incident on the partially reflecting surface 16 part of it is transmitted through the partially reflecting surface 16 as a reference beam towards a reference mirror 14. The reference beam is then projected onto a different part of the same detector 18 or alternatively on to a different detector (not shown).

One or more interference filters 13 are available to select a wavelength of interest in the range of, say, 405-790 nm or even lower, such as 200-300 nm. The interference filter may be tunable rather than comprising a set of different filters. A grating could be used instead of an interference filter. An aperture stop or spatial light modulator (not shown) may be provided in the illumination path to control the range of angle of incidence of radiation on the target.

The detector 18 may measure the intensity of redirected radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may be etched into or on the substrate (e.g., into one or more layers on the substrate). The pattern (e.g., of bars, pillars or vias) is sensitive to change in processing in the patterning process (e.g., optical aberration in the lithographic projection apparatus (particularly the projection system PS), focus change, dose change, etc.) and will manifest in a variation in the printed grating. Accordingly, the measured data of the printed grating is used to reconstruct the grating. One or more parameters of the 1-D grating, such as line width and/or shape, or one or more parameters of the 2-D grating, such as pillar or via width or length or shape, may be input to the reconstruction process, performed by processor PU, from knowledge of the printing step and/or other inspection processes.

In addition to measurement of a parameter by reconstruction, angle resolved scatterometry is useful in the measurement of asymmetry of features in product and/or resist patterns. A particular application of asymmetry measurement is for the measurement of overlay, where the target 30 comprises one set of periodic features superimposed on another. The concepts of asymmetry measurement using the instrument of FIG. 12 or FIG. 13 are described, for example, in U.S. patent application publication US2006-066855, which is incorporated herein in its entirety. Simply stated, while the positions of the diffraction orders in the diffraction spectrum of the target are determined only by the periodicity of the target, asymmetry in the diffraction spectrum is indicative of asymmetry in the individual features which make up the target. In the instrument of FIG. 13, where detector 18 may be an image sensor, such asymmetry in the diffraction orders appears directly as asymmetry in the pupil image recorded by detector 18. This asymmetry can be measured by digital image processing in unit PU, and calibrated against known values of overlay.

Figure 14:
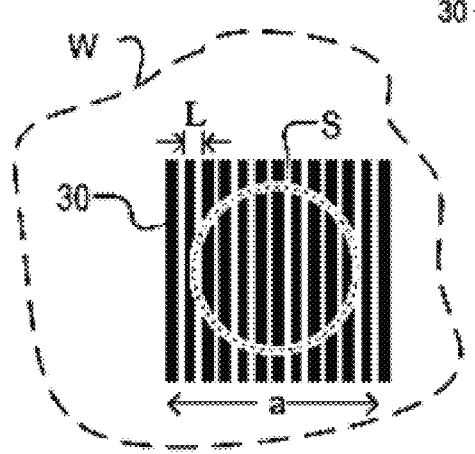
FIG. 14 illustrates the relationship between an illumination spot of an inspection apparatus and a metrology target.

FIG. 14 illustrates a plan view of a typical target 30, and the extent of illumination spot S in the apparatus of FIG. 13. To obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. The illumination arrangement 2, 12, 13, 17 may be configured to provide illumination of a uniform intensity across a back focal plane of objective 15. Alternatively, by, e.g., including an aperture in the illumination path, illumination may be restricted to on axis or off axis directions.

Figure 15:
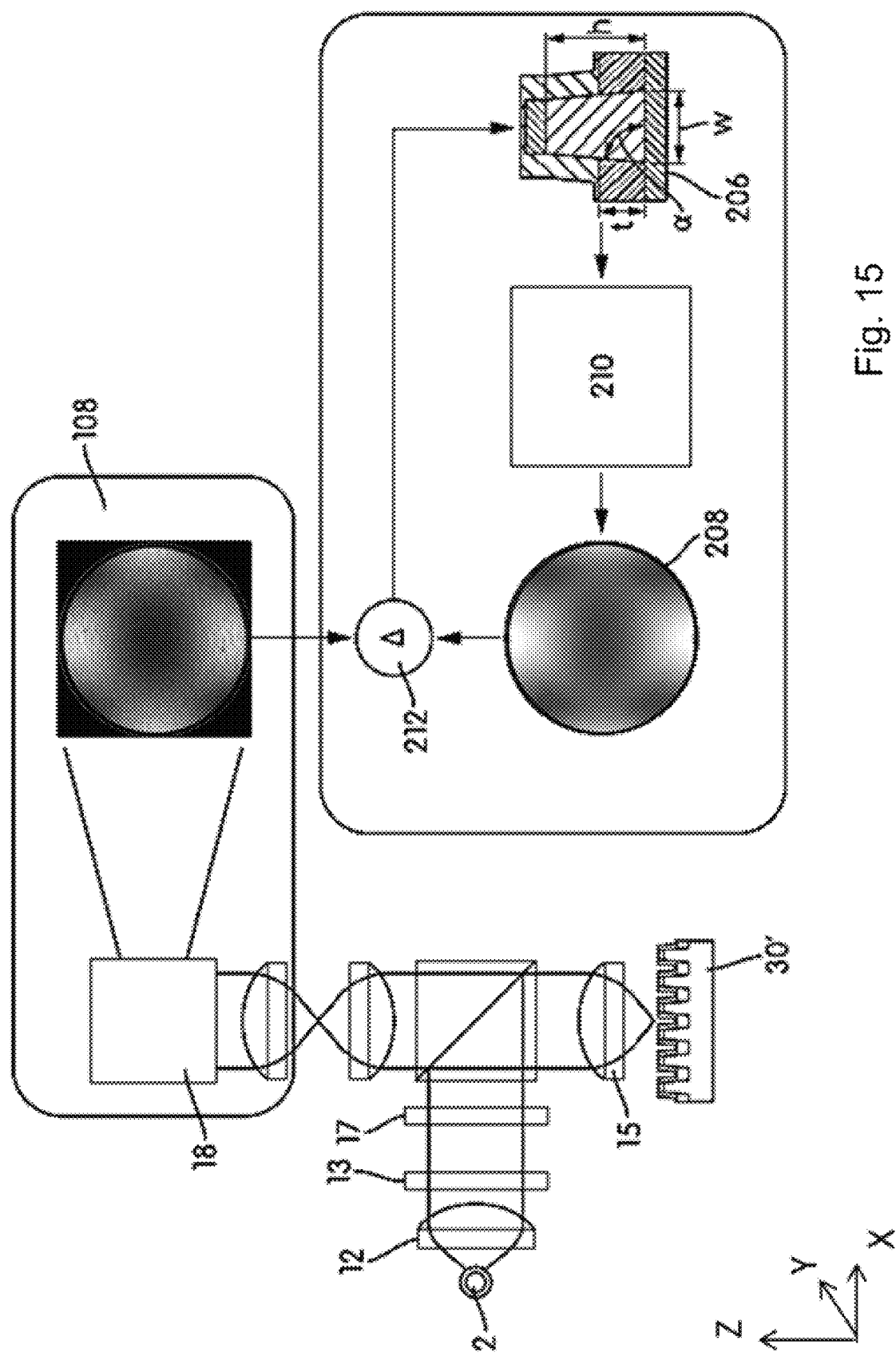
FIG. 15 schematically depicts a process of deriving a plurality of variables of interest based on measurement data.

FIG. 15 schematically depicts an example process of the determination of the value of one or more variables of interest of a target pattern 30' based on measurement data obtained using metrology. Radiation detected by the detector 18 provides a measured radiation distribution 108 for target 30'.

For a given target 30', a radiation distribution 208 can be computed/simulated from a parameterized model 206 using, for example, a numerical Maxwell solver 210. The parameterized model 206 shows example layers of various materials making up, and associated with, the target. The parameterized model 206 may include one or more of variables for the features and layers of the portion of the target under consideration, which may be varied and derived. As shown in FIG. 15, the one or more of the variables may include the thickness t of one or more layers, a width w (e.g., CD) of one or more features, a height h of one or more features, and/or a sidewall angle α of one or more features. Although not shown, the one or more of the variables may further include, but is not limited to, the refractive index (e.g., a real or complex refractive index, refractive index tensor, etc.) of one or more of the layers, the extinction coefficient of one or more layers, the absorption of one or more layers, resist loss during development, a footing of one or more features, and/or line edge roughness of one or more features. The initial values of the variables may be those expected for the target being measured. The measured radiation distribution 108 is then compared at 212 to the computed radiation distribution 208 to determine the difference between the two. If there is a difference, the values of one or more of the variables of the parameterized model 206 may be varied, a new computed radiation distribution 208 calculated and compared against the measured radiation distribution 108 until there is sufficient match between the measured radiation distribution 108 and the computed radiation distribution 208. At that point, the values of the variables of the parameterized model 206 provide a good or best match of the geometry of the actual target 30'. In an embodiment, there is sufficient match when a difference between the measured radiation distribution 108 and the computed radiation distribution 208 is within a tolerance threshold.

One or more of the variables in the parameterized model can have a stronger impact on the computed radiation distribution than one or more other variables. For example, a small percentage change of one or more variables may result in a significant difference in the computed radiation distribution. Such a variable may be referred to as a strong variable. A strong variable may include, but is not limited to, a critical dimension of a feature. On the other hand, a significant percentage change of one or more other variables may result in a small difference in the computed radiation distribution. Such a variable may be referred to as a weak variable. A weak variable may include, but is not limited to, the sidewall angle of a feature, a height of a feature, a thickness of a layer, resist loss during development, footing of a feature, a refractive index of a layer, an absorption of a layer, and/or an extinction coefficient of the layer.

Both strong and weak variables in the parameterized model may be used by a user (e.g., a human, a control system, etc.) for evaluating one or more steps of the patterning process. Specifically, one or more weak variables may be useful to determine whether there is a defect on the target 30' or other pattern, which can be used in one or more processes upstream, or downstream, to the pattern transfer in a lithography apparatus, such as spin coating, PEB, development, etching, deposition, doping, and/or packaging. For example, when the sidewall angle of a pattern on the substrate exceeds a certain threshold, one or more defects may be likely to be produced due to etching. As such, a defect likely due to etching may be predicted before the etching process based on a value of sidewall angle of the pattern on the substrate. Such examples are non-limiting.

However, it is challenging to determine the values of the weak variables based on the measurement directly. This is because the signals that may be used to determine the values of the weak variables in the inspection system are usually quite weak, and sometimes, too weak to be detected. In addition, it is difficult to provide a certain level of the accuracy of determining the values of weak variables particularly when there are many variables in the parameterized model and the values of the strong variables are unknown.

In order to obtain more accurate values of one or more weak variables for various uses (e.g., to predict a defect) through a reconstruction process as described in FIG. 15, it is desirable to determine the values of the one or more strong variables (e.g., a CD) in the parameterized model outside of the reconstruction process per se.

Figure 16:
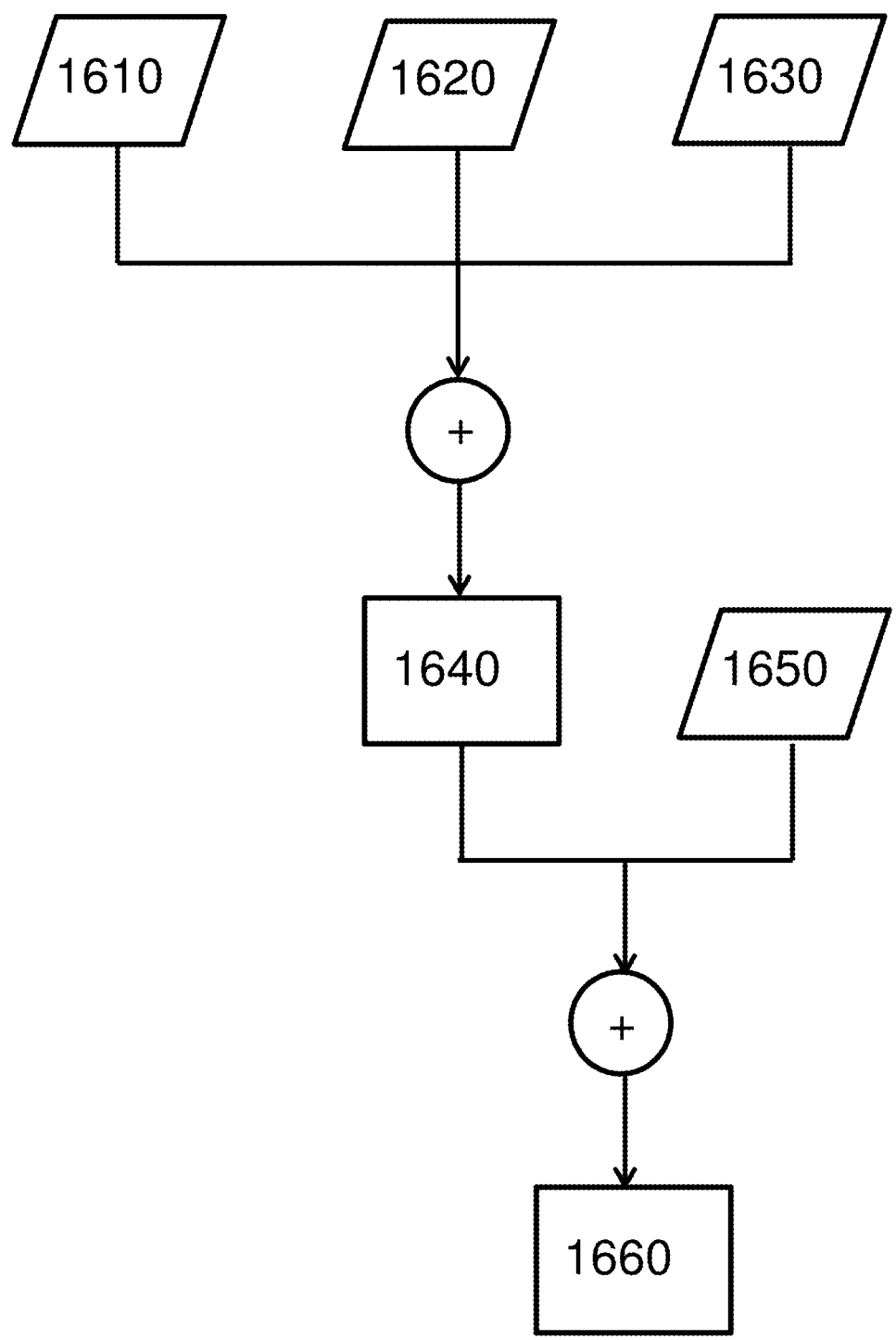
FIG. 16 schematically shows a flow for a method, according to an embodiment.

FIG. 16 shows a flow of a method to determine values of a strong variable on a substrate (which can avoid performing metrology of the strong variable on the substrate) according to an embodiment. The process can be applied to obtain values of a plurality of different strong variables. As shown, a fingerprint of the strong variable 1640 for a substrate may be obtained by combining a first contribution 1610 from a first group of one or more variables related to the lithographic apparatus (such as focus, dose, MSD, aberration, pupil shape, etc. and which can be spatially specified per die/field and repeated across the substrate under application conditions or spatially specified across the substrate), a second contribution 1620 from a second group of one or more variables related to one or more fabrication processes prior to, or after, pattern transfer in the lithographic apparatus (such as etch, development, etc. and which can be spatially specified across the substrate), and a third contribution 1630 from a third group of one or more variables related to the patterning device used in the patterning process (such as mask CD, etc. and which can be spatially specified per die/field and repeated across the substrate under application conditions or spatially specified across the substrate). The fingerprint of the strong variable 1640 can be obtained for any specific portion of the substrate, such as the portion of target 30'.

The first group of one or more variables related to the lithographic apparatus may be one or more modelable variables as described above. The first contribution 1610 may be lithographic apparatus specific; that is, the first contribution 1610 is specific to a certain actual lithographic apparatus. In an embodiment, the first contribution 1610 is not specific to a particular substrate (and so can be used across substrates). Thus, the first contribution 1610 may be pre-characterized and obtained from a database later for the reconstruction process. This first contribution 1610 can be applied to a specific substrate by combining it with data of the one or more variables for the specific substrate and a sensitivity relationship. The first contribution 1610 may be substrate specific. For example, the first contribution 1610 may be determined for each substrate or a specific group of substrates so that the fingerprint of the strong variable 1640 is specific to the substrate or group of substrates. Examples of the first group of variables may include, but is not limited to, variables of the illumination, projection system, focus, dose, bandwidth, exposure duration, a characteristic of high frequency stage movement (e.g., moving standard deviation (MSD) of movement of the substrate stage, moving average of the movement of the substrate stage, etc.), a high frequency laser bandwidth change (e.g., frequency, amplitude, etc.), a high frequency laser wavelength change, and/or flatness of the substrate.

The third group of one or more variables related to the patterning device may be one or more modelable variables as described above. The third contribution 1630 may be pattern or patterning device specific; that is, the third contribution 1630 is specific to a certain actual patterning device or specific pattern to be provided by a patterning device. The third contribution 1630 can be substrate independent. Thus, the third contribution 1630 may be pre-characterized and obtained from a database later for the reconstruction process. Examples of the third group of variables may include, but is not limited to, mask CD, a shape and/or location of an assist feature, an adjustment applied by a resolution enhancement technique (RET), etc.

The second group of one or more variables related to one or more fabrication processes prior to, or after, pattern transfer in the lithographic apparatus may be unmodeled variables as described above. Like the first contribution 1610, the second contribution 1620 may be substrate independent or substrate dependent. In an embodiment, the second contribution 1620 may be used repeatedly across every substrate. Therefore, the second contribution 1620 may be pre-characterized and obtained from a database during the reconstruction process. Examples of the second group of one or more variables may include, but is not limited to, various characteristics of a process upstream or downstream to pattern transfer in the lithographic apparatus, such as spin coating, PEB, development, etching, deposition, doping, and/or packaging.

The first contribution 1610, the second contribution 1620 and/or the third contribution 1630 may be characterized by experimentation or taken from prior production data, e.g., using the flows of any of FIGS. 4-6. In an embodiment, the third contribution 1630 (i.e., the patterning device fingerprint) may be obtained by measuring the patterning device directly using a patterning device metrology tool.

After the fingerprint 1640 of the strong variable is determined, a value of the strong variable 1660 may be obtained by combining the fingerprint 1640 of the strong variable and a certain value 1650 of the strong variable. In an embodiment, the certain value of the strong variable can be a nominal design value. In an embodiment, the strong variable may be an average of a group of measurements of the strong variable on the substrate. The group of measurements of the strong variable may be performed with respect to a same feature in two or more dies on the substrate.

Given the values of one or more strong variables in the parameterized model (e.g., by fixing the values of the one or more strong variables, or restricting the value of each of the one or more strong variables within a predetermined range (e.g., within 10%, within 5%, within 3%, within 1%), one or more weak variables may be adjusted until the computed radiation distribution is substantially similar to the measured radiation distribution, or a difference between the computed radiation distribution and the measured radiation distribution is within a predetermined tolerance threshold. When the computed radiation distribution is substantially similar to the measured radiation distribution, or the difference is within the predetermined tolerance threshold, values of the one or more weak variables may be output.

As described above, the values of one or more weak variables may be used to predict whether there would be a defect due to one or more downstream processes after exposure, e.g., PEB, development of a resist layer, etching, deposition, doping, and/or packaging. If a defect is predicted, a value of one or more of the variables of the first group of one or more variables, the second group of one or more variables, and/or the third group of one or more variables may be adjusted to obtain a new fingerprint of the strong variable. This is done so that a new set of values of one or more weak variables may be reconstructed using the process described above. Such adjustment may be performed iteratively until no defect is predicted based on a new set of values of the one or more weak variables.

In a further application of the contribution/fingerprint discussed above, a contour of a pattern can be predicted using one or more contributions/fingerprints. In this context, a contour is an outline of a shape of a feature of a pattern transferred to a substrate. A contour can be, for example, visualized by processing an image (e.g., scanning electron microscope image) of a substrate to extract the outer boundary of shape of a pattern feature transferred to the substrate. But, a contour can also be generated by mathematical processes (e.g., simulation) to create an electronic representation of a pattern feature as it is expected to be transferred to the substrate. While a contour will typically be in the form of a line, the contour as used herein can be generalized more to data describing the boundary of the feature. The contour need not be continuous; that is, the outline and/or data can be discontinuous around the feature if the discontinuous outline and/or data sufficiently describes the boundary of the feature. In an embodiment, the contour can be two-dimensional (i.e., defined a plane) or three-dimensional. In an embodiment, the contour can extend in a plane substantially parallel to the surface of the substrate on which the pattern is formed. In an embodiment, the contour can extend in a plane substantially perpendicular to the surface of the substrate on which the pattern is formed; in which case it can be characterized as a profile and can be of two-dimensional or three-dimensional form.

Figure 17:
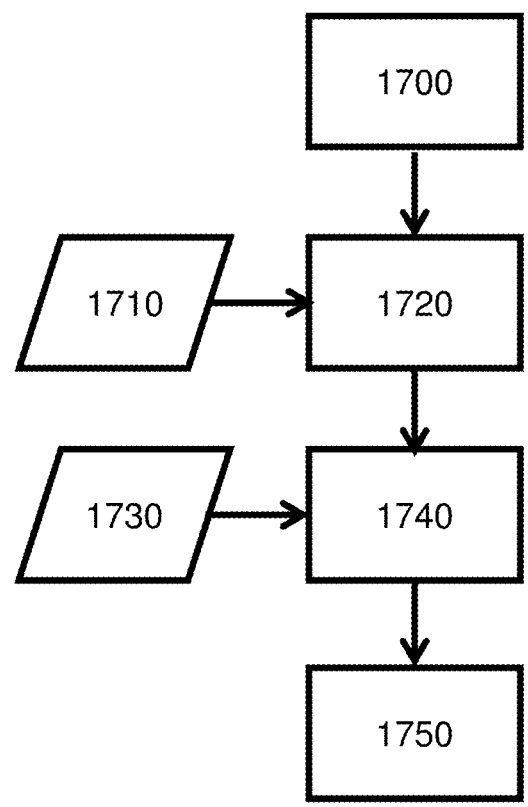
FIG. 17 schematically shows a flow for a method, according to an embodiment.

To predict the contour, one or more contributions/fingerprints can be obtained as described herein and used to select a certain nominal contour and/or modify a nominal contour, in order to arrive at a predicted contour. Referring to FIG. 17, an embodiment of a flowchart of a method of prediction of a contour is depicted. At 1700, a nominal contour of the feature of a pattern is determined. In an embodiment, the nominal contour is a contour as expected in resist. In an embodiment, the nominal contour is a contour as expected in a developed resist.

In an embodiment, the nominal contour can be obtained by mathematical calculation via a model and/or simulation. In an embodiment, the simulator or model, e.g., a simulator such as ASML's Tachyon product, can determine an expected contour of a feature of a pattern at applicable design values for one or more processing variables for the patterning process of the feature. This contour obtained by calculation can then be designated as a nominal contour. Similarly, the simulator or model can determine contours at various different values of the one or more processing variables (e.g., one or more optical settings or conditions such as different focus settings or conditions, different dose settings or conditions, different projection system aberration settings or conditions, different illumination pupil shape settings or conditions, etc.) to obtain a plurality of contours of the feature, each contour at a different value of the one or more processing variables. These contours obtained by calculation can then be designated as nominal contours with each nominal contour associated with a different value of the one or more processing variables. In an embodiment, the nominal contours are determined for different focus settings or conditions and so each of the nominal contours can be associated with a different focus setting or condition (such as a certain variance from best focus). While the description below focuses on focus settings or conditions, the nominal contours can be determined for different settings or conditions than focus and can be determined for various combinations of settings or conditions.

In an embodiment, the impact of the one or more processing variables for which the nominal contour is determined on one or more other processing variables, is evaluated. In an embodiment, the one or more other processing variables evaluated are one or more processing variables that have impact on the shape and/or size of the contour. So, in an embodiment, where the nominal contour is determined for a focus setting, the impact of focus on one or more other processing variables (such as CD) is determined. In an embodiment, this impact can be determined using a focus exposure matrix (FEM) type process, wherein a certain pattern is evaluated at at least different focus settings or conditions. The CD at those different focus settings or conditions can then be determined so as to evaluate how much a change in CD is due to focus. In an embodiment, the impact described above can be determined experimentally using one or more processed substrates which are then measured by a metrology tool. In an embodiment, the impact described above can be determined using a simulator.

Additionally or alternatively to determining the nominal contour(s) by calculation, in an embodiment, the nominal contour(s) can be obtained by experiment. For example, the feature can be created on one or more substrates at applicable design values of one or more processing variables for the patterning process and then measured (e.g., using a scanning electron microscope) to derive the contour of the feature. This contour obtained by measurement can then be designated as a nominal contour. Additionally or alternatively, the feature can be created on one or more substrates at various different values of one or more processing variables (e.g., one or more optical settings or conditions as discussed above) and then measured (e.g., using a scanning electron microscope) to derive a plurality of contours of the feature, each contour at a different value of the one or more processing variables. These contours obtained by measurement can then be designated as nominal contours with each nominal contour associated with a different value of the one or more processing variables. So, as a particular example, each of the nominal contours can be associated with a different focus setting or condition (such as a certain variance from best focus).

So, in an embodiment, the nominal contour(s) can provide an indication of the shape of the contour. For example, the nominal contour(s) can provide an indication of the shape of the contour at a particular focus condition. So, in the case of multiple nominal contours obtained a plurality of different focus conditions, each nominal contour can provide an indication of the shape of the predicted contour at the applicable focus condition.

Thus, in an embodiment and as will be discussed further, with nominal contours that are each associated with a different value of one or more processing variables (e.g., focus), the shape of a contour can be predicted, for any value of the one or more processing variables, by reference to the nominal contours. Where a nominal contour is not available for a particular value of the one or more processing variables, a contour can be generated by interpolation, extrapolation, etc. So, as an example, for any focus value on a certain location on a substrate, the shape of the contour of the applicable pattern feature(s) of interest can be predicted.

So, at 1710, a first contribution/fingerprint can be obtained for the one or more processing variables for which the nominal contour(s) has been determined. The first contribution/fingerprint can be obtained using any of the techniques described herein. In an embodiment, the first contribution/fingerprint corresponds to a situation prior to etch.

Figure 18:
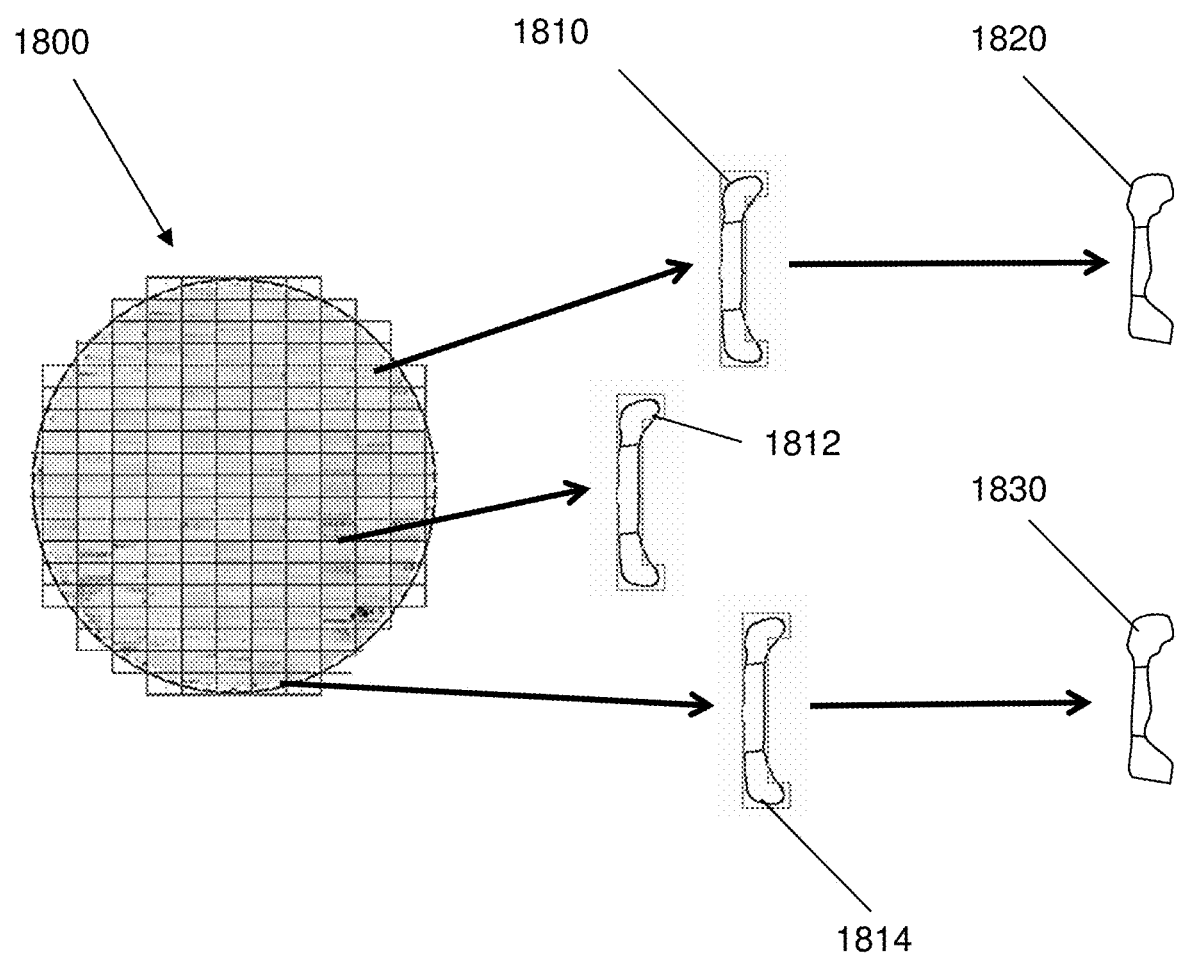
FIG. 18 schematically depicts an example contribution/fingerprint and an embodiment of selection of a contour.

In an embodiment, the first contribution/fingerprint is of focus and thus, in an embodiment, the first contribution/fingerprint is an across substrate focus map. In an embodiment, the first contribution/fingerprint can be generated based on data obtained from the lithographic apparatus used to pattern the substrate. For example, the lithographic apparatus can provide focus information (e.g., focus residual errors, etc.) and/or a characteristic of high frequency stage movement (e.g., MSD) to construct the focus map. FIG. 18 shows an example focus map 1800 for a patterning process, wherein different shades schematically represent different variances from a nominal focus (e.g., best focus, an average focus, etc.).

At 1720, the first contribution/fingerprint 1710 is used to select a nominal contour for a feature of interest. For example, at a particular location on the substrate and for a particular feature of interest, a value for the one or more processing variables for which the nominal contour(s) has been determined, can be determined from the first contribution/fingerprint 1710 and then used to select the associated nominal contour(s). Thus, in an example, where the first contribution/fingerprint 1710 is a focus map, the focus estimate at a substrate location within the focus map can be used to obtain the associated nominal contour as a prediction of the contour. Thus, a predicted contour can be determined per feature and per substrate location.

Referring to FIG. 18 again, an example of such selection is depicted. In FIG. 18, nominal contours 1810, 1812, 1814 at best focus are shown. Now, at the location on the focus map 1800 associated with nominal contour 1812, the focus map indicates that focus was at or near best focus. Accordingly, for that location, the nominal contour 1812 would be selected as a predicted contour. For the location associated with nominal contour 1810, the focus map indicates that focus was at a negative defocus −F. So, in that case, instead of using the nominal contour 1810, a nominal contour determined for negative defocus −F, namely nominal contour 1820 would be selected. As seen in FIG. 18, the nominal contour 1820 has the characteristics of the feature but has a different shape due to negative defocus −F. Similarly, for the location associated with nominal contour 1814, the focus map indicates that focus was at a positive defocus +F. So, in that case, instead of using the nominal contour 1814, a nominal contour determined for positive defocus +F, namely nominal contour 1830 would be selected. As seen in FIG. 18, the nominal contour 1830 has the characteristics of the feature but has a different shape due to positive defocus +F. Thus, with a focus of −F, the nominal contour at best focus changes shape and similarly, with a focus of +F, the nominal contour at best focus changes shape. So, for example, if F is variance from best focus and +F and −F have the same absolute value, then the respective contour shape changes may be the same as shown in FIG. 18.

Referring back to FIG. 17, at 1730, a second contribution/fingerprint can be obtained for one or more processing variables other than the one or more processing variables for which the nominal contour(s) has been determined. The second contribution/fingerprint 1730 can be obtained using any of the techniques described herein. In an embodiment, the second contribution/fingerprint corresponds to a situation post-etch.

Figure 19:
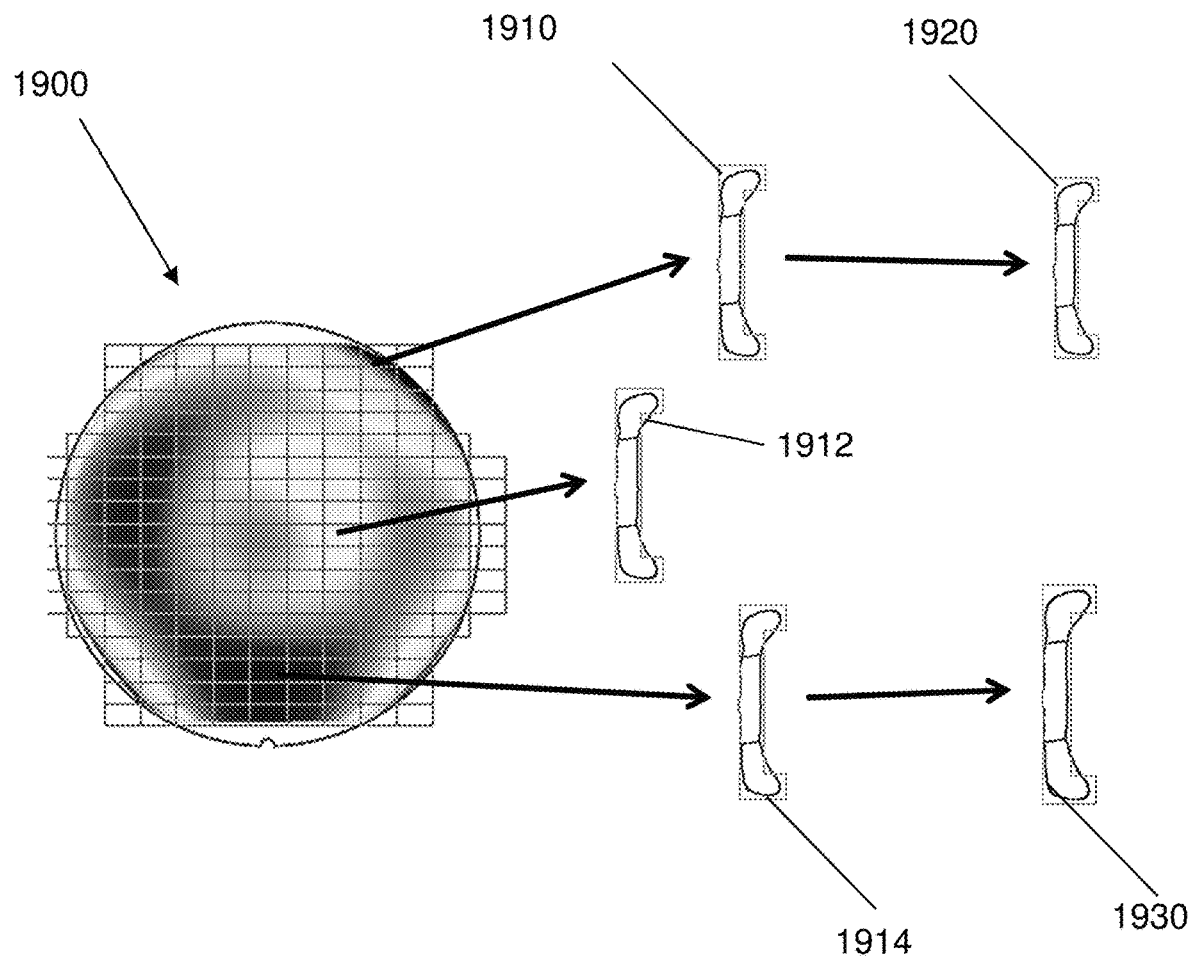
FIG. 19 schematically depicts an example contribution/fingerprint and an embodiment of modification of a contour.

In an embodiment, the second contribution/fingerprint 1730 is of critical dimension and thus, in an embodiment, the second contribution/fingerprint is an across substrate critical dimension map (e.g., critical dimension uniformity map). In an embodiment, the contribution/fingerprint can be generated based on data measured, using a metrology tool, on one or more substrates having the pattern after the etching step of the patterning process. FIG. 19 shows an example critical dimension map 1900 for a patterning process, wherein different shades schematically represent different variances from a nominal critical dimension (e.g., design critical dimension, an average critical dimension, etc.). So, for example, critical dimension map 1800 can represent critical dimension measured on an anchor aspect and plotted as a % of average critical dimension.

In an embodiment, the second contribution/fingerprint is corrected for the impact of the one or more processing variables associated with the first contribution/fingerprint on the one or more processing variables of the second contribution/fingerprint. So, for example, wherein the first contribution/fingerprint is a focus map and the second contribution/fingerprint is a critical dimension map, the second contribution/fingerprint can be corrected for the impact of focus (e.g., the focus information (e.g., focus residual errors, etc.) and/or a characteristic of high frequency stage movement)) on the critical dimension in the second contribution/fingerprint. Details of determining such an impact were described above. For example, a FEM can be used to isolate the focus impact on CD arising during the pattern transfer step and then remove that impact from after-etch CD measurements. Additionally or alternatively, various lithographic apparatus signals can be processed to arrive at an estimate of the focus during pattern transfer and its impact on CD and then remove that impact from after-etch CD measurements. As will be appreciated, the correction can be made in various ways, including incorporating the correction directly into the second contribution/fingerprint, making a correction after a value is selected from the second contribution/fingerprint as discussed below in relation to 1740, etc.

At 1740, the second contribution/fingerprint 1730 is used to modify a nominal contour for a feature of interest. In an embodiment, the nominal contour is the nominal contour selected at 1720. However, the selection at 1720 could be skipped (but the modification performed) if a given nominal contour is already selected for the feature of interest without using the selection step at 1720. Similarly, the modification at 1740 could be skipped if a nominal contour is selected at step 1720 and it doesn't require modification.

So, at 1740, for example, at a particular location on the substrate and for a particular feature of interest, a value for the one or more other processing variables is obtained from the second contribution/fingerprint 1730 and the value is then used to determine an appropriate modification of the nominal contour. In an embodiment, the modification is a change in size of the nominal contour. Thus, in an example, where the second contribution/fingerprint 1730 is a critical dimension map, the critical dimension estimate at a substrate location within the critical dimension map can be used to modify the size of the nominal contour (e.g., the nominal contour selected at 1720) as a prediction of the contour. Thus, a predicted contour can be determined per feature and per substrate location.

In an embodiment, a value of one or more other processing variables obtained at a certain location from the second contribution/fingerprint 1730 is assumed to apply to the entire feature of interest. So, if the critical dimension of a feature represented in the second contribution/fingerprint 1730 deviates from a certain critical dimension (e.g., average critical dimension) by a certain amount (e.g., 5%), then all critical dimensions of any feature at the same location will deviate by the same amount. Thus, this assumption means that a complete contour is resized by the same amount as the deviation in critical dimension. So, assuming a complete contour size of feature at a certain location on the substrate changes relatively the same amount as the critical dimension of an anchor aspect at the same location that has been measured to obtain the second contribution/fingerprint 1730, then a nominal contour can be shrunk by x % when critical dimension decreases by x % and the nominal contour expands by x % when the critical dimension increases by x %. The change is provided uniformly across the whole contour.

Referring to FIG. 19 again, an example of such change in size is depicted. In FIG. 19, nominal contours 1910, 1912, 1914 are shown. Now, at the location on the critical dimension map 1900 associated with nominal contour 1912 (which can be selected using step 1720), the critical dimension map indicates that the critical dimension corresponds to a nominal critical dimension (e.g., design critical dimension, an average critical dimension, etc.) Accordingly, for that location, the nominal contour 1912 would be selected as a predicted contour. For the location associated with nominal contour 1910, the critical dimension map indicates that critical dimension was lower by a certain amount (e.g., −x %). So, in that case, instead of using the nominal contour 1910, the nominal contour 1910 is shrunken by the certain amount (e.g., −x %) to obtain predicted contour 1920. As seen in FIG. 19, the contour 1920 has the characteristics of the feature but has a smaller size due to the lower critical dimension. Similarly, for the location associated with nominal contour 1914, the critical dimension map indicates that critical dimension was higher by a certain amount (e.g., +x %). So, in that case, instead of using the nominal contour 1914, the nominal contour 1914 is increased in size by the certain amount (e.g., +x %) to obtain predicted contour 1930. As seen in FIG. 19, the contour 1930 has the characteristics of the feature but has a larger size due to the higher critical dimension. Thus, with a critical dimension of −x %, the nominal contour is uniformly shrunken but still retains its shape, and with a critical dimension of +x %, the nominal contour is uniformly increased in size but still retains its shape.

So, in an embodiment, given these two assumptions (namely that a value of a certain one or more processing variables (e.g., focus) can predict contour shape and a value of a certain one or more other processing variables (e.g., CD) can predict contour size), a contour shape and size can be predicted for feature based on a value selected from one or more contributions/fingerprints. In particular, for every location on a substrate, the complete contours for one or more features of interest can be predicted. In an embodiment, the feature of interest is a determined hot spot.

In a particular embodiment, a contour is predicted from critical dimension and focus measurements. In a particular embodiment, a contour is estimated using critical dimension and focus fingerprints.

At 1750, the predicted contour can be used in various applications. For example, the contour can be checked in of itself, or in relation to one or more other contours, to determine whether a defect is predicted (e.g., there can be made one or more checks for necking, bridging, line pull back, line thinning, overlapping, resist top loss, and/or resist undercut). This technique can be useful in particular, for example, for determining bridging defects. These defects are caused by two features touching each other, which can in principle happen at any point on the contours of two features (depending on the particular CD, focus, and/or overlay conditions at that location). Use of contours enables more robust evaluation of such defects compared with, e.g., evaluation of dimensions at cut lines on the adjacent features.

As another example, the contour can be used to evaluate edge placement position and/or error (which could also be used to identify a defect such as bridging). In effect, this technique can provide a computational form of metrology to determine edge placement error. For example, with a predicted contour, a "virtual" edge placement error can be predicted. This can be used, for example, in multi-patterning defect predictions that are edge placement error driven. Thus, edge placement error driven defects can be estimated using CD and focus fingerprints.

An example where the predicted contour can be used to determine a potential defect is in a spacer-and-cut layer process. An example of this is presented in FIGS. 20A-C. FIG. 20A depicts an example spacer-and-cut layer process wherein lines 2000 are "cut" using a pattern 2010. FIG. 20A depicts the nominal process where the lines 2000 and pattern 2010 are at the desired alignment, size, etc. The result of such a process would be a clean cut of the middle line 2000 by pattern 2010. Now, the process of FIG. 17 can be applied using the maps 1800 and 1900 shown schematically in FIG. 20 to arrive at a determination of the predicted contours of lines 2000 and pattern 2010. In this example, shown in FIG. 20B, it is determined that the contour of pattern 2010 has been predicted to increase in size (although in this example the shape has not changed but it could have), while the predicted contours of lines 2000 are as expected. Now, FIG. 20C shows the result if the predicted contour of pattern 2010 were used in the spacer-and-cut layer process. As seen at 2020, the pattern 2010 would undesirably cut a portion of the upper and lower lines 2000. Thus, in an embodiment, the predicted operation of the spacer-and-cut layer process could be flagged as producing a potential defect when pattern 2010 is used to cut lines 2000.

As another example, the predicted contour can be used to determine a potential defect in a litho-etch litho-etch (LELE) process. An example of this is presented in FIGS. 21A-C. FIG. 21A depicts an example litho-etch and litho-etch process wherein lines 2100 are created in a first litho-etch process and the pattern 2110 is interleaved with the lines 2100 through a second litho-etch process. FIG. 21A depicts the nominal process where the lines 2100 and pattern 2110 are at the desired alignment, size, etc. The result of such a process would be a designed separation between the pattern 2110 and the lines 2100. Now, the process of FIG. 17 can be applied using the maps 1800 and 1900 shown schematically in FIG. 21 to arrive at a determination of the predicted contours of lines 2100 and pattern 2110. In this example, shown in FIG. 21B, it is determined that the contour of pattern 2110 has been predicted to increase in size and change in shape, while the predicted contours of lines 2100 are as expected. Now, FIG. 21C shows the result if the predicted contour of pattern 2110 were used in the litho-etch and litho-etch process. As seen at 2120, the pattern 2110 would undesirably be too close to the lower line 2100 (e.g., the space between the features is below a certain threshold); that is it be an overlap area or violate a minimum distance requirement. This could result in a bridging defect. Further, the pattern 2110 could have a necking defect 2130 where the feature has changed in shape such that is has become too narrow (e.g., the width has gone below a threshold). Thus, in an embodiment, the predicted operation of the litho-etch and litho-etch process could be flagged as producing one or more potential defects when pattern 2110 is created in conjunction with lines 2100. Thus, in an embodiment, for defect prediction in a multiple exposure LELE type application, the predicted contour should be able to improve the prediction capability of necking and/or bridging defects compared to using only defect indicators/cut-lines.

In another possible use of the predicted contour, the predict contour can be used in model calibration, particularly calibration of an optical proximity correction model. The predicted contour enables the correction of etch fingerprints and/or focus fingerprints in measured gauges (contours). For example, this predicted contour can be used to calibrate a mask data preparation after-etch model.

Thus, in an embodiment, this technique enables contour prediction from a virtual wafer; thus, the technique combines metrology with computation in order to generate contours without having to measure them. In an embodiment, the technique enables prediction of variability in contours and edge placement error across a substrate, given appropriate fingerprints (e.g., an after etch critical dimension fingerprint and a lithographic apparatus focus fingerprint). In an embodiment, the technique enables better prediction capability for multi-patterning. In an embodiment, the technique enables pattern control by using edge placement optimization based on a predicted contour.

The results of the methods herein (or another result (e.g., a defect prediction) derived from the results of the methods herein) can be used for various purposes including control of a process in the patterning process or an apparatus therein, monitoring of substrates produced by the patterning process, design of a process or apparatus of the patterning process, etc. For example, the results or another result derived therefrom can be used to alter an apparatus or process of the patterning process for the further processing of the substrate or for the processing of another substrate. For example, the results can be used to predict a defect. Prediction of a defect can be used, for example, to control a metrology tool to inspect the affected area and/or alter an apparatus or process of the patterning process for the further processing of the substrate or for the processing of another substrate. Further, the results can be used to design the patterning process by, e.g., deriving a dose recipe for correction of the lithographic apparatus, enabling design of the patterning device and its pattern, setup of a process, etc. Further, the results can be used in model calibration, e.g., calibration of an optical proximity correction model, a source-mask optimization model, a lithographic manufacturing check model, a resist model, an imaging model, a measurement model (e.g., models the process of measuring), etc. The results can be used to determine one or more variables of a process (e.g., best exposure and/or best dose) which can then be used for various purposes. As will be appreciated, there can be many other uses.

Figure 22:
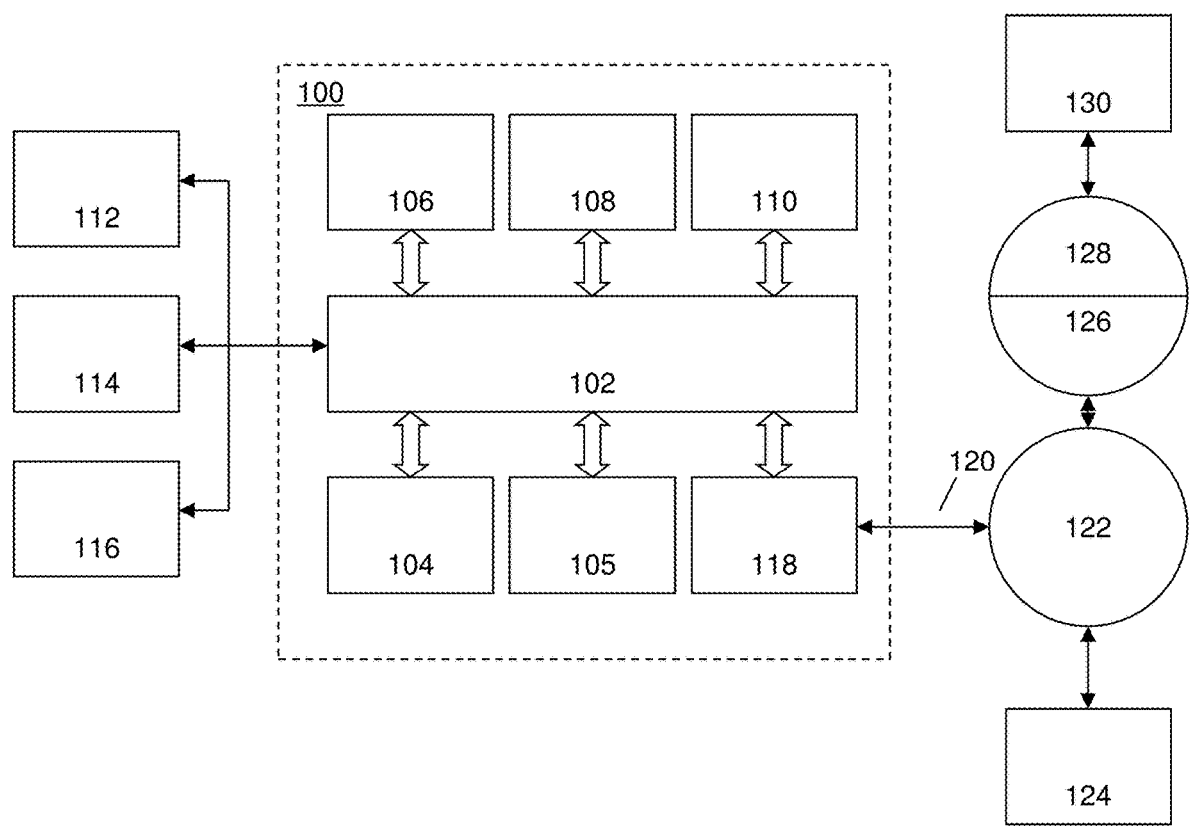
FIG. 22 is a block diagram of an example computer system.

FIG. 22 is a block diagram that illustrates a computer system 100 which can assist in implementing methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are example forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed, change in order or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

The embodiments may further be described using the following clauses:

1. A method comprising:
obtaining a first contribution of a first processing variable that is modeled to metrology data of a pattern on a substrate;
obtaining a second contribution of a second processing variable that is not modeled to the metrology data of the pattern; and
obtaining, by a hardware computer, the metrology data by combining the first contribution and the second contribution.

2. The method of clause 1, wherein the metrology data comprise a critical dimension (CD), a critical dimension uniformity (CDU), a sidewall angle, an edge position, overlay, focus, pattern shift, or a combination selected therefrom.

3. The method of clause 1 or clause 2, wherein the metrology data comprise a statistic of a group of patterns.

4. The method of any of clauses 1 to 3, wherein the second processing variable is a characteristic of a process downstream to exposure of the substrate.

5. The method of clause 4, wherein the process is development of a resist layer on the substrate.

6. The method of clause 4, wherein the process is etching of the substrate.

7. The method of any of clauses 1 to 3, wherein the second processing variable is a characteristic of the substrate.

8. The method of any of clauses 1 to 3, wherein the second processing variable is a characteristic of a resist layer on the substrate.

9. The method of any of clauses 1 to 8, wherein a value of the second processing variable is unknown.

10. The method of any of clauses 1 to 9, wherein combining the first contribution and the second contribution comprises adding the first contribution and the second contribution, or convoluting the first contribution and the second contribution.

11. A method comprising:
obtaining a contribution of a second processing variable to metrology data of a pattern on a substrate by removing, by a hardware computer, from the metrology data a contribution of a first processing variable to the metrology data.

12. The method of clause 11, wherein the first processing variable is modeled.

13. The method of clause 12, wherein obtaining the contribution of the first processing variable is by modeling.

14. The method of clause 12, wherein the contribution of the first processing variable is a non-linear function of the second processing variable.

15. The method of clause 11, wherein the first processing variable is not modeled.

16. The method of clause 15, wherein the contribution of the first processing variable is determined experimentally or empirically.

17. A method comprising:
obtaining a contribution of change of a second group of one or more processing variables to metrology data of a first pattern on a substrate by removing from the metrology data a contribution of change of a first group of one or more processing variables to the metrology data; and
obtaining, by a hardware computer, a contribution of change of the second group of one or more processing variables to metrology data of a second pattern on the substrate based on the contribution of change of the second group of one or more processing variables to the metrology data of the first pattern.

18. The method of clause 17, further comprising reducing a probability of a defect at the second pattern by adjusting one or more variables of the first group of one or more processing variables based on the contribution of change of the second group of one or more processing variables to metrology data of the second pattern.

19. The method of clause 18, wherein the probability of a defect at the second pattern is reduced without performing metrology on the second pattern.

20. The method of clause 17, wherein the contribution of change of the second group of one or more processing variables to the metrology data of the second pattern is obtained without obtaining the metrology data of the second pattern.

21. The method of clause 17, further comprising obtaining a contribution of change of the first group of one or more processing variables to the metrology data of the second pattern by removing from the metrology data of the second pattern the contribution of change of the second group of one or more processing variables to the metrology data of the second pattern.

22. The method of clause 21, wherein the contribution of change of the first group of one or more processing variables to the metrology data of the second pattern is obtained without obtaining values of the first group of one or more processing variables for the second pattern.

23. The method of clause 21, further comprising reducing a probability of a defect at the second pattern by adjusting one or more processing variables of the first group of one or more processing variables based on: the contribution of change of the first group of one or more processing variables to the metrology data of the second pattern, the contribution of change of the second group of one or more processing variables to the metrology data of the second pattern, or both.

24. A method comprising:
obtaining a contribution of change of a second group of one or more processing variables to metrology data of a first pattern by removing from the metrology data a contribution of change of a first group of processing variables to the metrology data of the first pattern;
obtaining a contribution of change of the second group of one or more processing variables to metrology data of a second pattern on the substrate based on the contribution of change of the second group of one or more processing variables to the metrology data of the first pattern; and
obtaining, by a hardware computer, a sub-process window (sub-PW) spanned by the first group of processing variables for the second pattern based on the contribution of change of the second group of one or more processing variables to the metrology data of the second pattern.

25. The method of clause 24, wherein the first group comprises all processing variables that are modeled and the second group comprises all processing variables that are not modeled.

26. The method of clause 24, further comprising decreasing a probability of a defect at the second pattern by adjusting a value of one or more of the first group of processing variables based on the sub-PW.

27. A method comprising:
obtaining an estimate of metrology data of a hot spot by combining a contribution of change of a first group of one or more processing variables that are modeled to the metrology data and a contribution of change of a second group of one or more processing variables that are not modeled to the metrology data; and
determining, by a hardware computer, whether there is a defect at the hot spot based on the estimate of the metrology data.

28. The method of clause 27, wherein the estimate is obtained without performing metrology on the hot spot.

29. A method comprising:
obtaining a contribution of a change of a second group of one or more processing variables to metrology data of a pattern by removing from the metrology data a contribution of change of a first group of one or more processing variables; and
obtaining values of parameters of a model for determining the contribution of change of the second group of one or more processing variables to the metrology data, by fitting, by a hardware computer, the parameters against the contribution of change of the second group of one or more processing variables to the metrology data of the pattern.

30. The method of clause 29, wherein the first group of one or more processing variables comprises all processing variables that are not modeled.

31. The method of clause 29, wherein all the processing variables of the second group of one or more processing variables are modeled.

32. A method comprising:
obtaining an estimate of metrology data of a pattern on a substrate by combining contributions of changes of processing variables that are modeled to the metrology data and contributions of changes of processing variables that are not modeled to the metrology data;
determining whether the estimate of the metrology data meets a criterion; and if the estimate does not meet the criterion, adjusting, by a hardware computer, a relationship between the processing variables that are modeled and the contributions of changes of the processing variables that are not modeled to the metrology data.

33. The method of clause 32, wherein adjusting the relationship comprises changing a chemical composition of a resist on the substrate.

34. The method of clause 32, wherein adjusting the relationship comprises changing a chemical used in developing a resist on the substrate.

35. The method of clause 32, wherein adjusting the relationship comprises changing an etching apparatus used to etch the substrate.

36. A method comprising:
computing a value of a first variable of a pattern of, or for, a substrate processed by a patterning process by combining a fingerprint of the first variable on the substrate and a certain value of the first variable; and
determining a value of a second variable of the pattern based at least in part on the computed value of the first variable.

37. The method of clause 36, wherein the determining the value of the second variable of the pattern comprises adjusting, by a hardware computer, the second variable until a reconstruction or simulation result based at least in part on the computed value of the first variable and on the second variable satisfies a rule.

38. The method of clause 37, wherein the rule indicates a difference between a measurement result of the pattern on the substrate and the reconstruction/simulation result crosses or meets a threshold.

39. The method of clause 36 or clause 37, wherein the reconstruction/simulation result is a computed radiation distribution, and the measurement result is a measured radiation distribution.

40. The method of any of clauses 37 to 39, wherein a change in the first variable results in a greater difference in the reconstruction or simulation result than a same change in the second variable.

41. The method of any of clauses 36 to 40, wherein the first variable is related to a metrology target on a substrate.

42. The method of clause 41, wherein the first variable is a critical dimension of a pattern of the metrology target on the substrate.

43. The method of any of clauses 36 to 42, wherein the second variable is related to the metrology target on the substrate.

44. The method of clause 43, wherein the second variable comprises one or more selected from: a sidewall angle of a pattern of the metrology target, a height of a pattern of the metrology target, a thickness of a layer of the metrology target, a resist loss in the pattern of the metrology target during development, footing of the metrology target, a refractive index of a layer of the metrology target, absorption of a layer of the metrology target, and/or an extinction coefficient of a layer of the metrology target.

45. The method of any of clauses 36 to 44, further comprising predicting whether there is a defect following a process downstream to transfer of the pattern onto the substrate based on the second variable of the pattern.

46. The method of clause 45, wherein responsive to a prediction of a defect at the pattern following the process downstream to transfer of the pattern onto the substrate, adjusting a variable of the patterning process for the substrate or another substrate.

47. The method of clause 45 or clause 46, wherein the process comprises development of a resist layer on the substrate.

48. The method of any of clauses 45 to 47, wherein the process comprises etching of the substrate.

49. The method of any of clauses 36 to 48, further comprising obtaining the fingerprint of the first variable by combining a first contribution from a first group of one or more variables related to a lithographic apparatus of the patterning process, a second contribution from a second group of one or more variables related to one or more fabrication processes prior to, or after, transfer of the pattern in the lithographic apparatus, and a third contribution from a third group of one or more variables related to a patterning device used in the transfer of the pattern.

50. The method of clause 49, wherein the first group of variables includes one or more variables of illumination by the lithographic apparatus, a projection system of the lithographic apparatus, a moving standard deviation of movement of a substrate stage of the lithographic apparatus, a moving average of movement of the substrate stage, focus, dose, bandwidth, exposure duration, a high frequency laser bandwidth change, a high frequency laser wavelength change, and/or flatness of the substrate.

51. The method of clause 49 or clause 50, wherein the second group of variables includes one or more variables of spin coating, post exposure bake, development, etching, deposition, doping, and/or packaging.

52. The method of any of clauses 49 to 51, wherein the third group of variables includes one or more variables of mask CD, a shape and/or location of an assist pattern, and/or an adjustment applied by a resolution enhancement technique.

53. The method of any of clauses 36 to 52, wherein combining the fingerprint of the first variable and the certain value of the first variable comprises adding the fingerprint of the first variable and the certain value of the first variable.

54. The method of any of clauses 36 to 53, wherein the certain value of the first variable is obtained by averaging a group of measurements of the first variable on the substrate.

55. The method of any of clauses 36 to 53, wherein the certain value of the first variable is a design value of the first variable.

56. The method of any of clauses 36 to 54, wherein the first variable used during the determining the value of the second variable has a value restricted within a certain range around the computed value of the first variable.

57. A method comprising:
obtaining an across substrate fingerprint of a variable associated with a pattern created by a patterning process; and
predicting, by a hardware computer system, a contour of a feature of the pattern based on value of the variable selected from a substrate location within the fingerprint.

58. The method of clause 57, wherein the predicting comprises using the value of the variable to select a nominal contour of a certain shape for the feature.

59. The method of clause 58, wherein the nominal contour is obtained by calculation using a simulation or mathematical model.

60. The method of clause 58 or clause 59, wherein the nominal contour is a contour as expected in resist.

61. The method of any of clauses 57 to 60, wherein the predicting comprises changing a size of a nominal contour for the feature.

62. The method of clause 61, wherein the changing the size is based on a value of a further variable associated with the pattern, the value selected at the same substrate location from an across substrate fingerprint of the further variable.

63. The method of clause 62, wherein the across substrate fingerprint of the further variable corresponds to a situation post-etch.

64. The method of any of clause 62 or clause 63, wherein the further variable comprises critical dimension.

65. The method of any of clauses 57 to 64, wherein the variable comprises focus.

66. The method of any of clauses 57 to 65, wherein the feature is a determined hot spot.

67. The method of any of clauses 57 to 66, further comprising using the predicted contour to determine an edge placement position or error.

68. The method of any of clauses 57 to 67, further comprising using a check against the predicted contour to determine whether the feature or another feature is likely to be defective.

69. The method of any of clauses 57 to 68, further comprising using the predicted contour to calibrate a mathematical model.

70. The method of clause 69, wherein the mathematical model comprises an optical proximity correction model.

71. A computer program product comprising a non-transitory computer readable medium having instructions recorded thereon, the instructions when executed by a computer implementing the method of any of clauses 1 to 70.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

While specific embodiments of the disclosure have been described above, it will be appreciated that the embodiments may be practiced otherwise than as described.

What is claimed is:

1. A method comprising:
   determining, by a first computer model evaluated on a hardware computer system, a first contribution of a first processing variable to metrology data of a pattern on a substrate;
   obtaining a second contribution of a second processing variable to the metrology data, the second contribution not modeled to the metrology data of the pattern and extracted, separately from other contributions of other processing variables to metrology data, from actual measured values of the metrology data by removal of one or more contributions of one or more other processing variables to metrology data from the actual measured values;
   obtaining, by a second computer model evaluated on the hardware computer, estimated, simulated metrology data by combining the first contribution and the second contribution; and
   physically configuring or controlling a manufacturing, metrology or inspection process or device based on the obtained simulated metrology data and/or providing a signal being, or computed from, the obtained simulated metrology data to a manufacturing, metrology or inspection tool or system to bring about control or configuration of a manufacturing, metrology or inspection process performed using the respective manufacturing, metrology or inspection tool or system.

2. The method of claim 1, wherein the metrology data represents: a critical dimension (CD), a critical dimension uniformity (CDU), a sidewall angle, an edge position, overlay, focus, pattern shift, or a combination selected therefrom.

3. The method of claim 1, wherein the metrology data comprise a statistic of a group of patterns.

4. The method of claim 1, wherein the second processing variable is a characteristic of a process downstream to exposure of the substrate.

5. The method of claim 4, wherein the process is development of a resist layer on the substrate.

6. The method of claim 4, wherein the process is etching of the substrate.

7. The method of claim 1, wherein the second processing variable is a characteristic of the substrate.

8. The method of claim 1, wherein the second processing variable is a characteristic of a resist layer on the substrate.

9. The method of claim 1, wherein a value of the second processing variable is unknown.

10. The method of claim 1, wherein combining the first contribution and the second contribution comprises adding the first contribution and the second contribution, or convoluting the first contribution and the second contribution.

11. A method comprising:
    determining, by a first computer model evaluated on a hardware computer system, a first contribution of a processing variable to metrology data pertaining to a pattern;
    computing a value of a first variable of the pattern of, or for, a substrate processed by a patterning process by combining:
       a fingerprint of the first variable on the substrate, the fingerprint derived from the first contribution of the processing variable to metrology data pertaining to the pattern and a second contribution of a processing variable to metrology data pertaining to the pattern, the second contribution not modeled to metrology data pertaining to the pattern and extracted, separately from other contributions of other processing variables to metrology data, from actual measured values of the metrology data by removal of one or more contributions of one or more other processing variables to metrology data from the actual measured values, and a certain value of the first variable;
    determining, by a second computer model evaluated on the hardware computer system, a value of a second variable of the pattern based at least in part on the computed value of the first variable; and
    physically configuring or controlling a manufacturing, metrology or inspection process or device based on the obtained simulated metrology data and/or providing a signal being, or computed from, the obtained simulated metrology data to a manufacturing, metrology or inspection tool or system to bring about control or configuration of a manufacturing, metrology or inspection process performed using the respective manufacturing, metrology or inspection tool or system.

12. The method of claim 11, wherein the first variable and/or the second variable is related to a metrology target on a substrate.

13. The method of claim 11, further comprising predicting whether there is a defect following a process downstream to transfer of the pattern onto the substrate based on the second variable of the pattern.

14. The method of claim 13, wherein responsive to a prediction of a defect at the pattern following the process downstream to transfer of the pattern onto the substrate, adjusting a variable of the patterning process for the substrate or another substrate.

15. A computer program product comprising a non-transitory computer readable medium having instructions therein, the instructions when executed by a computer system, configured to cause the computer system to at least:
    determine, by a computer model, a first contribution of a first processing variable to metrology data of a pattern on a substrate;
    obtain a second contribution of a second processing variable to the metrology data, the second contribution not modeled to the metrology data of the pattern and extracted, separately from one or more other contributions of one or more other processing variables to metrology data, from actual measured values of the metrology data;
    obtain estimated, simulated metrology data by combining the first contribution and the second contribution; and
    cause physical configuration or control of a manufacturing, metrology or inspection process or device based on the obtained simulated metrology data and/or provide a signal being, or computed from, the obtained simulated metrology data to a manufacturing, metrology or inspection tool or system to bring about control or configuration of a manufacturing, metrology or inspection process performed using the respective manufacturing, metrology or inspection tool or system.

16. The computer program product of claim 15, wherein the metrology data represents: a critical dimension (CD), a critical dimension uniformity (CDU), a sidewall angle, an edge position, overlay, focus, pattern shift, or a combination selected therefrom.

17. The computer program product of claim 15, wherein the second processing variable is a characteristic of a process downstream to exposure of the substrate.

18. The computer program product of claim 15, wherein the second processing variable is a characteristic of the substrate.

19. The computer program product of claim 15, wherein the second processing variable is a characteristic of a resist layer on the substrate.

20. The computer program product of claim 15, wherein the instructions configured to combine the first contribution and the second contribution are configured to add the first contribution and the second contribution, or convolute the first contribution and the second contribution.

21. A computer program product comprising a non-transitory computer readable medium having instructions recorded thereon, the instructions when executed by a computer system, configured to cause the computer system to at least:
- determine, by a first computer model, a first contribution of a processing variable to metrology data pertaining to a pattern;
- compute a value of a first variable of the pattern of, or for, a substrate processed by a patterning process by combining:
  - a fingerprint of the first variable on the substrate, the fingerprint derived from the first contribution of the processing variable to metrology data pertaining to the pattern and a second contribution of a processing variable to metrology data pertaining to the pattern, the second contribution not modeled to metrology data pertaining to the pattern and extracted, separately from one or more other contributions of one or more other processing variables to metrology data, from actual measured values of the metrology data, and a certain value of the first variable;
- determine, by a second computer model, a value of a second variable of the pattern based at least in part on the computed value of the first variable; and
- cause physical control or configuration of a manufacturing, metrology or inspection process or device based on the obtained simulated metrology data and/or provide a signal being, or computed from, the obtained simulated metrology data to a manufacturing, metrology or inspection tool or system to bring about control or configuration of a manufacturing, metrology or inspection process performed using the respective manufacturing, metrology or inspection tool or system.

* * * * *